United States Patent
Komiyama et al.

(10) Patent No.: US 6,477,190 B1
(45) Date of Patent: Nov. 5, 2002

(54) OPTICAL MODULE

(75) Inventors: Manabu Komiyama; Tatsuro Kunikane, both of Kawasaki; Yoshimitsu Sakai; Masaki Kuribayashi, both of Sapporo, all of (JP)

(73) Assignee: Fujitsu Limited, Kawsaki (JP)

( * ) Notice: Subject to any disclaimer, the term of this patent is extended or adjusted under 35 U.S.C. 154(b) by 0 days.

(21) Appl. No.: 09/502,494

(22) Filed: Feb. 11, 2000

(30) Foreign Application Priority Data

Feb. 15, 1999 (JP) .......................... 11-036437
Jan. 31, 2000 (JP) .......................... 2000-023020

(51) Int. Cl.[7] .............................. H01S 3/13; H01S 3/04; H01S 3/00
(52) U.S. Cl. ................. 372/34; 372/29.01; 372/29.011; 372/29.02; 372/38.01; 372/38.02; 372/31
(58) Field of Search .............................. 372/36, 32, 34, 372/35, 29.01, 29.011, 29.02, 31, 23, 38.01, 38.02; 250/372, 227.3

(56) References Cited

U.S. PATENT DOCUMENTS

| | | | | |
|---|---|---|---|---|
| 4,815,081 A | * | 3/1989 | Mahlein et al. | 372/32 |
| 5,287,367 A | * | 2/1994 | Yanagawa | 372/31 |
| 5,943,352 A | * | 8/1999 | Fee | 372/32 |

* cited by examiner

Primary Examiner—Paul Ip
Assistant Examiner—Armando Rodriguez
(74) Attorney, Agent, or Firm—Staas & Halsey LLP

(57) ABSTRACT

An optical module includes a first level detecting part having a semi-transparent structure and receiving a light signal emitted from a light-emitting element, a second level detecting part receiving the light signal which penetrates through the first level detecting part and passes through an optical filter, and a control part controlling an operation temperature of the light-emitting element on the basis of electric signals output from the first and second level detecting parts.

26 Claims, 29 Drawing Sheets

FIG.15
ETALON ANGLE 0°
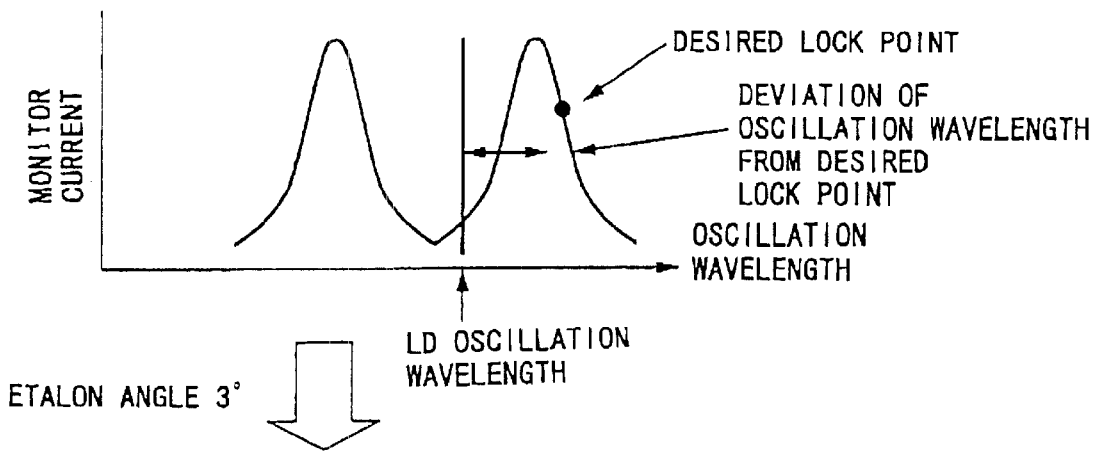
ETALON ANGLE 3°
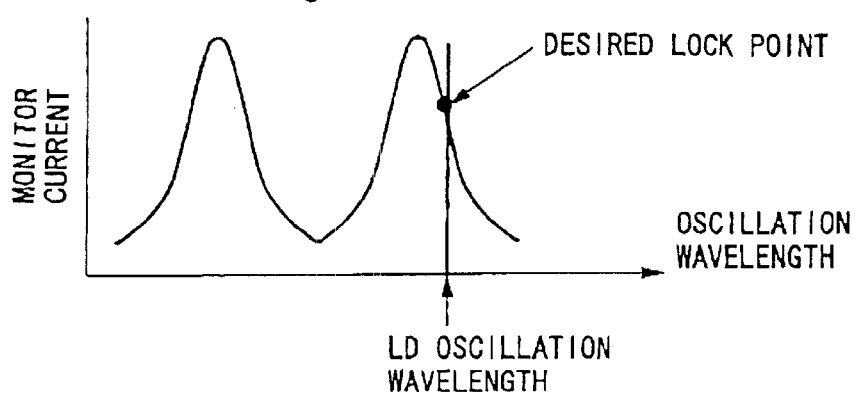

OPTICAL MODULE

BACKGROUND OF THE INVENTION

Field of the Invention

The present invention generally relates to optical modules, and more particularly to an optical module capable of stabilizing the wavelengths of light output signals.

A wavelength division multiplexing system (hereinafter referred to as a WDM system) using the wavelength division multiplexing technique has an increased transmission capacity as the number of wavelengths to be multiplexed increases. Thus, it is required to reduce the intervals of the wavelengths of the light signals in order to increase the channel capacity. However, it is necessary to improve the precision of the wavelengths of the light signals output from an optical module In order to reduce the intervals of the wavelengths of the light signals.

A conventional optical module has a module construction designed to suppress a time-based variation in the wavelength of a laser diode source or a variation therein due to the peripheral temperature and to lock the wavelength of the light signal to be output. An example of an optical module having such a module construction is an optical module having a wavelength locking function of suppressing a wavelength variation of the optical signal. The wavelength locking function is implemented by, for example, a wavelength detection module called wavelength locker.

A description will now be given, with reference to FIGS. 1 and 2, of an optical module which does not have a built-in locker. FIG. 1 is a side view of such an optical module 1, and FIG. 2 is a top view thereof.

The optical module 1 includes a laser diode (LD) element 10, an LD carrier 11, a photodiode (PD) carrier 12, a monitor photodiode (PD) 13, a thermoelectric (TEC) element 14, a first lens 15, a thermistor (temperature sensing resistor) 16, a mount carrier 17, an optical isolator 18, and a second lens 19.

The LD element 10, which is a light-emitting element, is mounted on the LD carrier 11, and outputs light signals in the back and forth directions. The light signal emitted forward is collimated by the first lens 15 placed on the mount carrier 17, and is supplied to the optical isolator 18.

The optical isolator 18 allows the forward light signal supplied from the first lens 15 to pass therethrough, and shuts off the reflected light supplied from the second lens 19 in the backward direction. The light signal passing through the optical isolator 18 is focused by the second lens 19, and is supplied to the optical fiber 20.

The light signal output from the LD element 10 in the backward direction is monitored by the monitor PD 13 mounted on the PD carrier 12, and is utilized to perform automatic power control (APC) directed to controlling the forward light signal output at a constant level.

The above-mentioned LD carrier 11, the PD carrier 12 and the first lens 15 are mounted on the TEC element 14 via the mount carrier 17. The thermistor 16 is mounted on the mount carrier 17, and monitors the temperature in the vicinity of the LD element 10.

A description will now be given, with reference to FIGS. 3 and 4, of an optical module having a built-in wavelength locker. FIG. 3 is a side view of such an optical module 2, and FIG. 4 is a top view thereof. The optical module 2 is the same as the optical module 1 except for some parts, and parts that are the same as those shown in FIGS. 1 and 2 are given the same reference numbers, The optical module 2 includes the LD element 10, the LD carrier 11, the PD carrier 12, the monitor PD 13, the TEC element 14, the first lens 15, the mount carrier 17, the optical isolator 18, the second lens 19, a back lens 21, a PD carrier 22, an optical filter 23, a beam splitter (BS) 24, and a monitor PD 25.

The light signal backward emitted from the LD element 10 is focused by the back lens 21 and is supplied to the beam splitter 24. Then, the beam splitter 24 reflects part of the received light signal, and allows the remaining part thereof to pass therethrough. Thus, the backward light signal is split into two lights. One of the two light beams thus split is monitored by the monitor PD 25 mounted on the PD carrier 22, and is utilized to perform the APC control directed to controlling the light signal output emitted forward to a constant level. The other of the two split-light signals is supplied, via the optical filter 23, to the monitor PD 13 mounted on the PD carrier 12.

The optical filter 23 used in the optical module 2 has a transmittance characteristic which is inclined to the wavelength of the light signal. For example, the optical filter 23 is an etalon filter (Fabry-Perot etalon filter), a lowpass filter, highpass filter, or a bandpass filter. A wavelength fixing control method of locking the wavelength of the light signal output from the LD element 10 is implemented using the outputs of the monitor PD 13 and the monitor PD 25.

FIG. 5 is a block diagram illustrating an example of the wavelength fixing control. The light signal backward emitted from the LD element 10 is partially reflected by a beam splatter 24-1, and is then supplied to the monitor PD 25. Of the light signal backward emitted from the LD element 10, the light signal passing through the beam splitter 24-1 is reflected by a beam splitter 24-2, and is supplied to the monitor PD 13 via a bandpass filter used as the optical filter 23. The monitor PDs 13 and 25 supply monitor currents as shown in FIG. 6 to a divider circuit 26, which will be described later. FIG. 6 is a graph of a monitor current vs. oscillation wavelength characteristic.

The monitor current output from the monitor PD 25 has a flat characteristic which does not depend on the frequency. The monitor current output from the monitor PD 13 indicates the performance of the optical filter 23 because the monitor PD 13 is supplied with the light signal via the optical filter 23.

For example, if it is wished to lock the oscillation wavelength at a wavelength $\lambda 1$ shown in FIG. 6, the oscillation wavelength of the LD element is set to $\lambda 1$ by utilizing the situation in which the oscillation wavelength of the LD element 10 varies due to the operation temperature thereof. Then, the divider circuit 26 is supplied with the monitor currents output from the PDs 13 and 25.

The divider circuit 26 performs a dividing operation on the values of the supplied monitor currents, and produces a resultant output signal as shown in FIG. 7, which shows an example of the output signal of the divider circuit 26.

As shown in FIG. 7, the output value of the divider circuit 26 increases or decreases when the oscillation wavelength deviates from $\lambda 1$. A temperature control circuit 27 shown in FIG. 5 controls the TEC element 14 in accordance with the value supplied form the divider circuit 26, and controls the temperature of the periphery of the LD element 10, whereby the oscillation wavelength of the LD element 10 can be adjusted.

However, the conventional optical module as shown in FIGS. 3 and 4 needs a large area for mounting the beam splitter 24 which splits the incident light into the two light components. Hence, the distances between the LD element 10 and the monitor PDs 13 and 25 increase, and the back lens 21 is required to compensate for the long distances. Thus, a large number of components is used to form the conventional optical module, which increases the cost.

Also, there is an increased number of points at which an optical adjustment such as an optical axis alignment is carried out. This increases the number of assembly steps.

Further, in order to increase the transmission or channel capacity, it is required to use a tunable LD element which can be tuned to a plurality of oscillation wavelengths in a single optical module and to improve the precision of the wavelengths of the light signals emitted from the tunable LD element.

SUMMARY OF THE INVENTION

It is a general object of the present invention to provide an optical module in which the above drawbacks are eliminated.

A more specific object of the present invention is to provide a less-expensive optical module assembled by a reduced number of components and capable of adjusting a plurality of oscillation frequencies with improved precision.

The above objects of the present invention are achieved by an optical module comprising: a first level detecting part having a semi-transparent structure and receiving a light signal emitted from a light-emitting element; a second level detecting part receiving the light signal which penetrates through the first level detecting part and passes through an optical filter; and a control part controlling an operation temperature of the light-emitting element on the basis of electric signals output from the first and second level detecting parts. Since the first level detecting part has the semi-transparent structure, the light signal penetrating through the first level detecting part can be applied to the second level detecting part without any optical components for splitting light. Hence, the optical module can be assembled by a reduced number of components at reduced cost.

The above objects of the present invention are also achieved by an optical module comprising: a light-emitting element capable of varying an oscillation wavelength based on an operation temperature; a splitter splitting a light signal emitted from the light-emitting element; a first level detecting part receiving a first split light signal from the splitter; a second level detecting part receiving a second split light signal from the splitter via an optical filter; a first control part controlling the operation temperature of the light-emitting element in accordance with electric signals output from the first and second level detecting parts; and a second control part controlling an operation temperature of the optical filter in accordance with the oscillation wavelength of the light-emitting element. The first and second control parts separately control the operation temperatures of the light-emitting element and the optical filter, respectively. Thus, the wavelength of the light signal emitted from the light-emitting element can be controlled precisely.

The above objects of the present invention are also achieved by an optical module comprising: a light-emitting element: a first temperature control part controlling a temperature of the light-emitting element; a first light receiving part receiving a light from the light-emitting part; a second light receiving part receiving the light from the light-emitting element via an optical filter; and a second temperature control part controlling a temperature of the optical filter. The first and second temperature control parts separately control the operation temperatures of the light-emitting element and the optical filter, respectively. Thus, the wavelength of the light signal emitted from the light-emitting element can be controlled precisely.

The above objects of the present invention are also achieved by an optical module comprising: a light-emitting element; a first light receiving part having a semi-transparent structure and receiving light from the light-emitting element; a second light receiving part receiving the light penetrating through the first light receiving part and passing through an optical filter: and a temperature control part controlling a temperature of the light-emitting element. Since the first light receiving part has the semi-transparent structure, the light signal penetrating through the first light receiving part can be applied to the second light receiving part without any optical components for splitting light. Hence, the optical module can be assembled by a reduced number of components at reduced cost. In addition, the operation temperature of the light-emitting element can be controlled, so that the wavelength of the light can easily be adjusted.

BRIEF DESCRIPTION OF THE DRAWINGS

Other objects, features and advantages of the present invention will become more apparent from the following detailed description when read in conjunction with the accompanying drawings, in which.

FIG. 15 shows a filter characteristic of the etalon filter with the incident angle equal to 0° and 3°.

DESCRIPTION OF THE PREFERRED EMBODIMENTS

Figure 8:
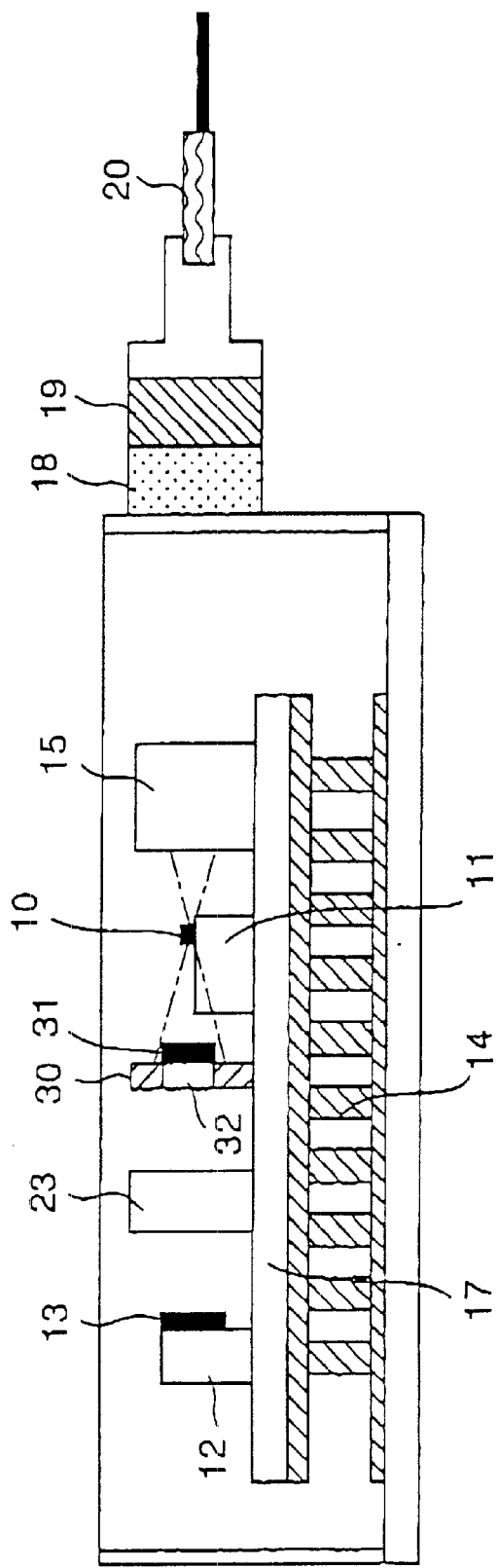
FIG. 8 is a side view of an optical module according to a first embodiment of the present invention.
Figure 9:
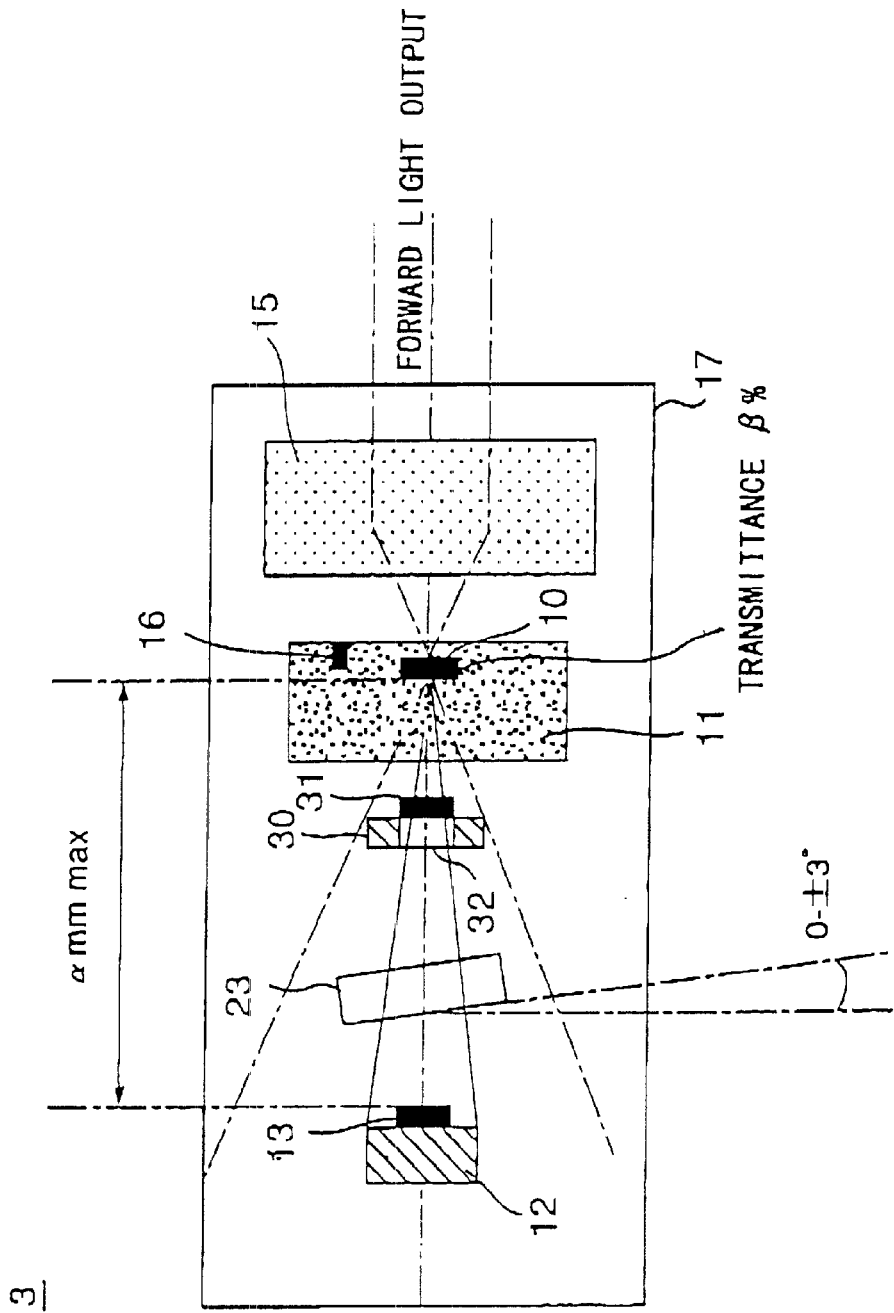
FIG. 9 is a top view of the optical module shown in FIG. 8.

A description will now be given, with reference to FIGS. 8 and 9, of an optical module 3 according to a first embodiment of the present invention. In FIGS. 8 and 9 parts that are the same as those shown in the previously described figures are given the same reference numbers.

The optical module 3 Includes the LD element 10, the LD carrier 11, the PD carrier 12, the monitor PD 13, the TEC element 14, the first lens 15, the thermistor 16, the mount carrier 17, the optical isolator 18, the second lens 19, the optical filter 23, a PD carrier 30, and a monitor PD 31.

The LD element 10 is mounted on the LD carrier 11, and emits light signals forward and backward. The light signal emitted from the LD element 10 in the forward direction is collimated by the first lens 15 mounted on the mount carrier 17, and is then supplied to the optical isolator 18.

The optical isolator 18 allows the forward light signal from the first lens 15 to pass therethrough, and shuts off the reflected light from the second lens 19 in the reverse direction, so that optical reflection can be prevented. The signal passing through the optical isolator 18 is focused by the second lens 19, and is supplied to the optical fiber 20.

The light signal emitted from the LD element in the backward direction is monitored by the monitor PD 31 having a semi-transparent structure mounted on the PD carrier 30. The semi-transparent structure of the monitor PD 31 is achieved by thinning the absorption layer of the photodiode. For example, the monitor PD 31 has a semi-transparency equal to or less than 50%.

The PD carrier 30, on which the monitor PD 31 is mounted, has a through hole 32 facing the light receiving part of the monitor PD 31. That is, the light signal emitted backward from the LD element 10 penetrates through the monitor PD 31, and goes through the hole 32. Then, the light signal passes through the optical filter 23, and is supplied to the monitor PD 13 mounted on the PD carrier 12.

The LD carrier 10, the PD carrier 12, the first lens 15, the optical filter 23, and the PD carrier 30 are mounted on the TEC element 14 via the mount carrier 17. The thermistor 16 is mounted on the LD carrier 11, and monitors the temperature of the periphery of the LD element 10. The TEC element 14 Is capable of adjusting the temperature of the periphery of the LD element 10 by utilizing, for example, the Peltier effect.

Figure 10:
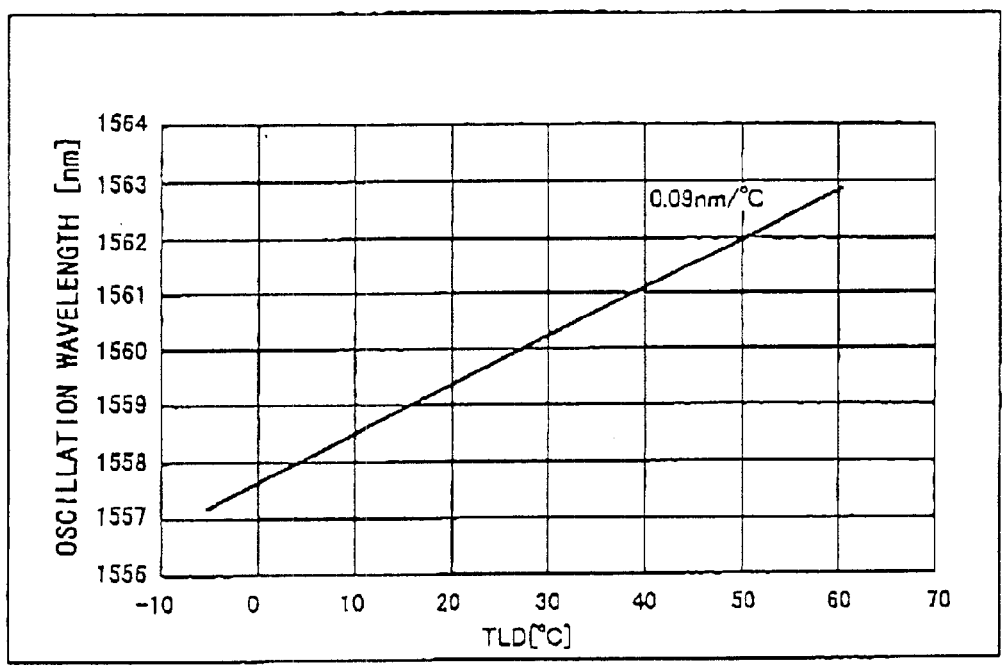
FIG. 10 is a graph of an oscillation wavelength vs. temperature characteristic of an LD element.

As shown in FIG. 10, when the operation temperature of the LD element 10 changes, the oscillation wavelength is varied. Thus, a desired oscillation wavelength can be obtained by adjusting the temperature of the periphery of the LD element 10. FIG. 10 is a graph of an oscillation wavelength vs. temperature characteristic of the LD element 10. In the case of FIG. 10, the LD element 10 has a temperature dependence of 0.09 nm/° C.

The light-receiving sensitivities of the monitor PDs 13 and 31 have temperature dependence. Thus, as in the case of the LD element 10, the monitor PDs 13 and 31 are mounted on the TEC element 14 via the PD carriers 12 and 30, so that the temperatures of the peripheries of the monitor PDs 13 and 31 can be adjusted.

The optical filter 23, to which the light signal penetrating through the monitor PD 31 of the semi-transparent structure is supplied, is formed of, for example, an etalon filter, a lowpass filter, a highpass filter or a bandpass filter.

Figure 11:
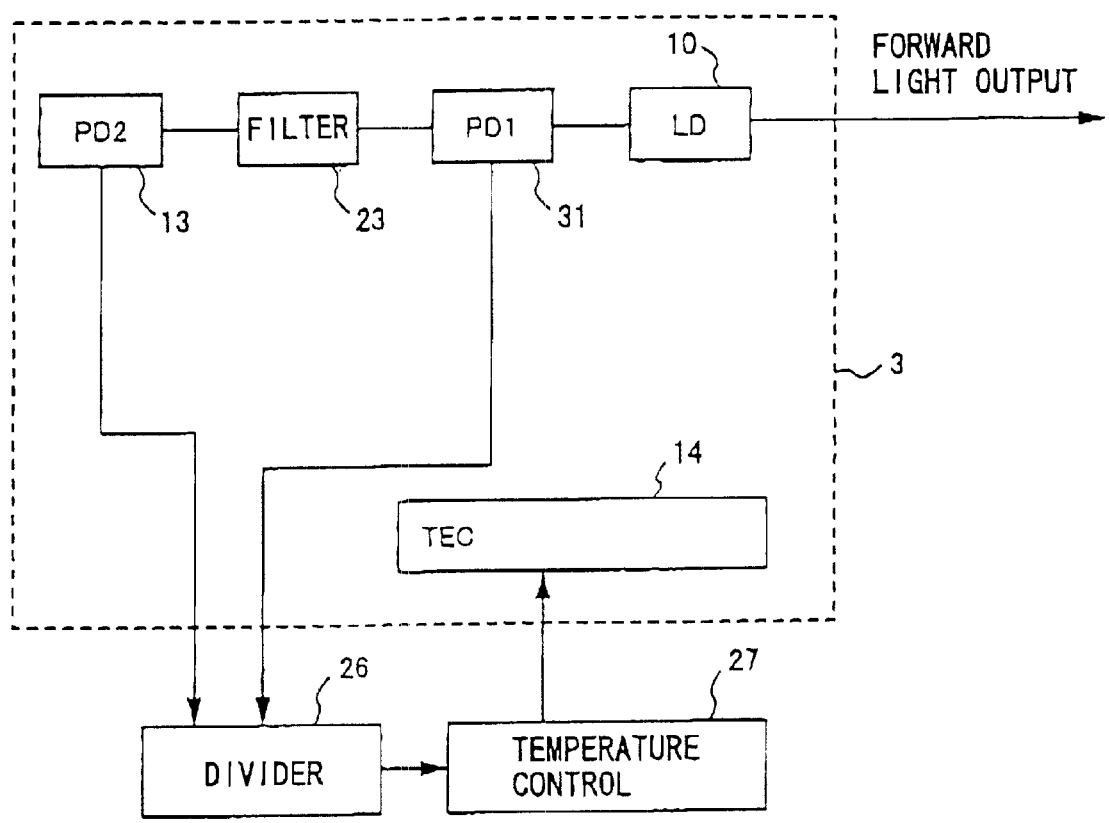
FIG. 11 is a block diagram of a mechanism for implementing a wavelength fixing control method.

A description will be given, with reference to FIG. 11 of a wavelength fixing control method for locking the wavelength of the light signal emitted from the LD element 10. FIG. 11 is a block diagram of a mechanism for implementing the wavelength fixing control method.

The light signal emitted backward from the LD element 10 is supplied to the monitor PD 31 of the semi-transparent structure. The light signal penetrating through the monitor PD 31 is supplied to the monitor PD 13 via the bandpass filter used as the optical filter 23. The monitor PDs 13 and 31 supply the divider circuit 26 with output monitor currents as shown in FIG. 6.

Figure 6:
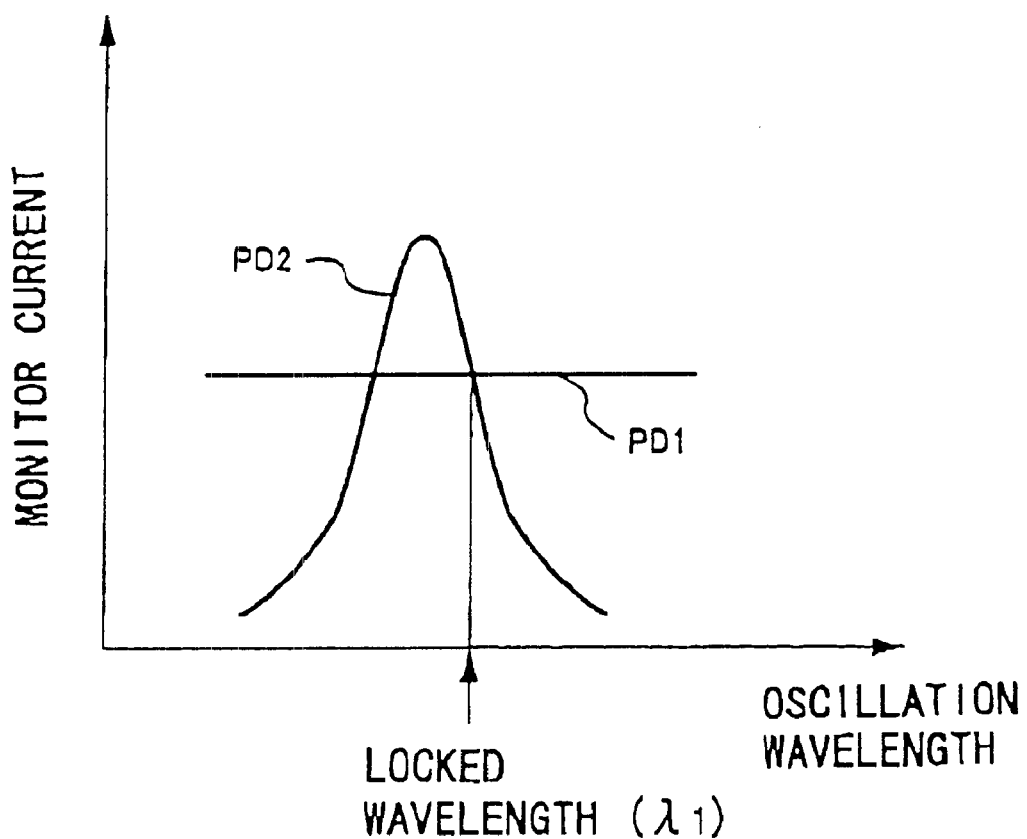
FIG. 6 is a graph of a monitor current vs. oscillation wavelength characteristic.

In FIG. 6, the monitor current has a flat characteristic which does not depend on the frequency. The monitor current output from the monitor PD 13 indicates the performance of the optical filter 23 because the monitor PD 13 is supplied with the light signal via the optical filter 23. For example. FIG. 6 shows the monitor current output from the monitor PD 13 when the optical filter 23 is formed of a bandpass filter.

Figure 5:
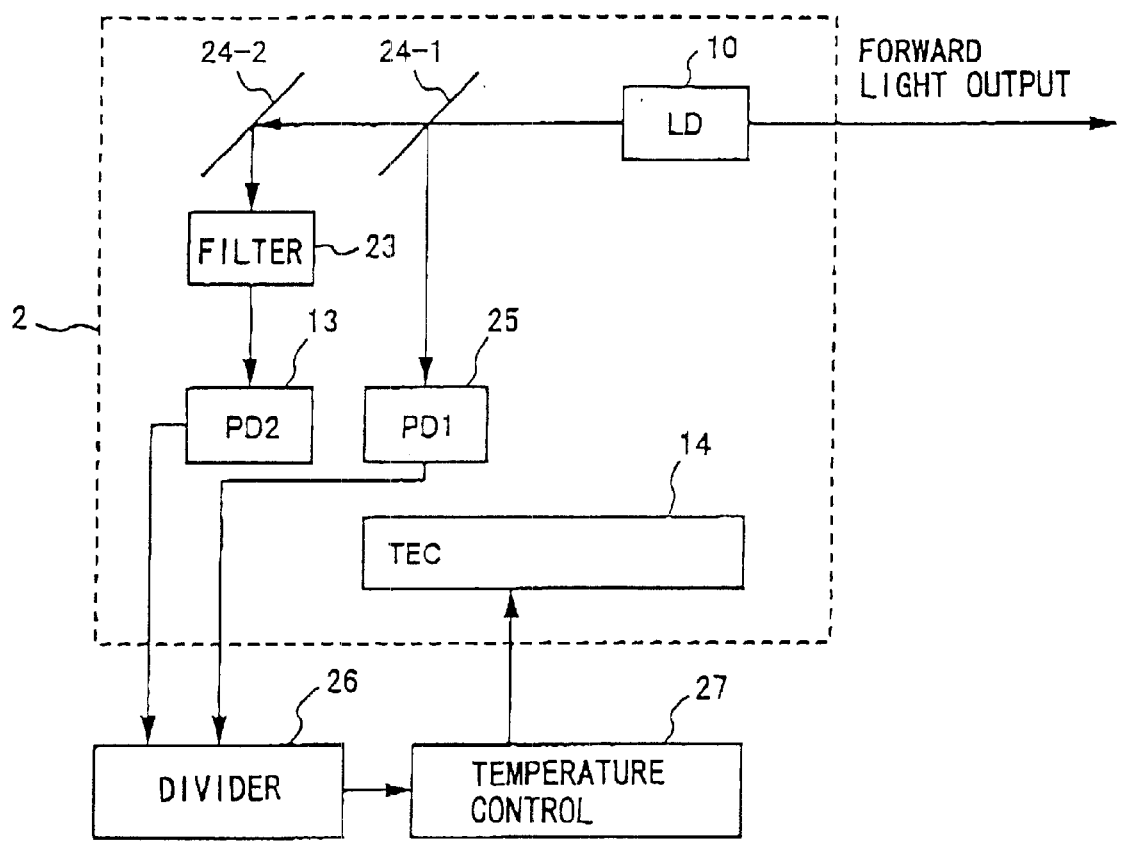
FIG. 5 is a block diagram illustrating a wavelength fixing control method.
Figure 7:
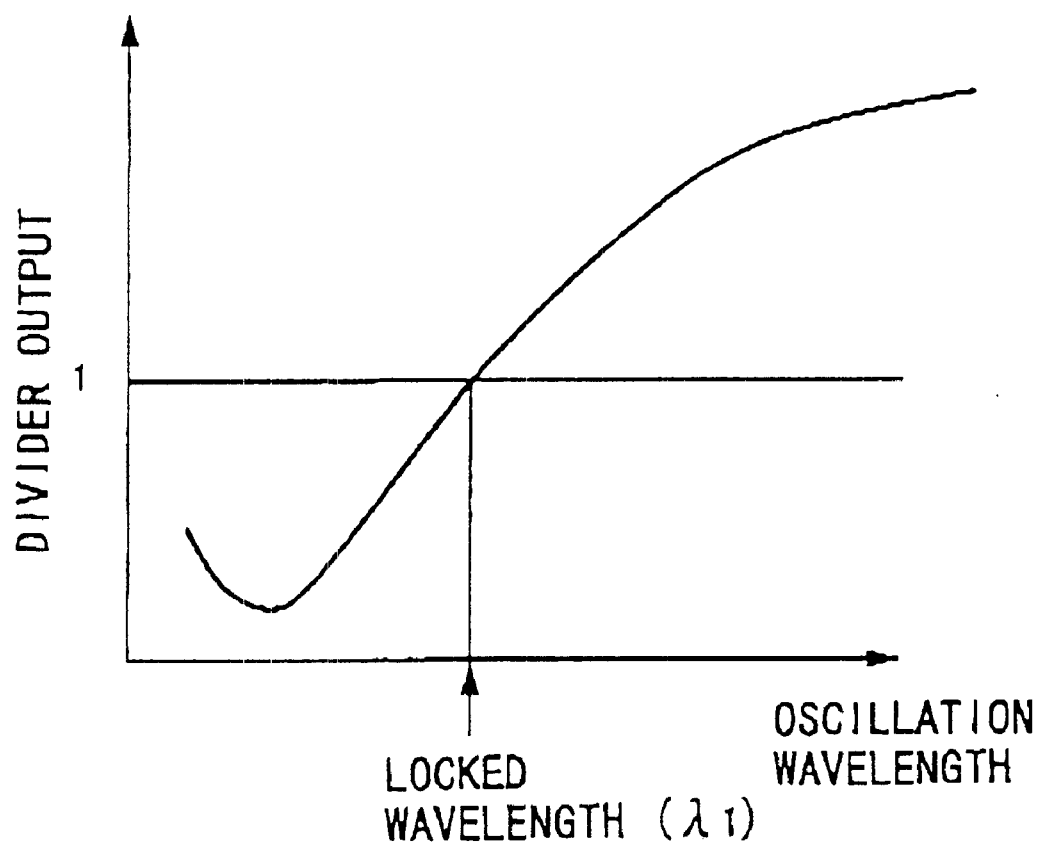
FIG. 7 is a graph of a divider circuit output vs. oscillation wavelength characteristic.

The divider circuit 26 performs the dividing operation on the values of the supplied monitor currents, and produces a resultant output signal as shown in FIG. 7. As shown in FIG. 7, the output value of the divider circuit 26 increases or decreases when the oscillation wavelength deviates from $\lambda 1$. A temperature control circuit 27 shown in FIG. 5 controls the TEC element 14 in accordance with the value supplied form the divider circuit 26, and controls the temperature of the periphery of the LD element 10, whereby the oscillation wavelength of the LD element 10 can be adjusted.

Figure 12:
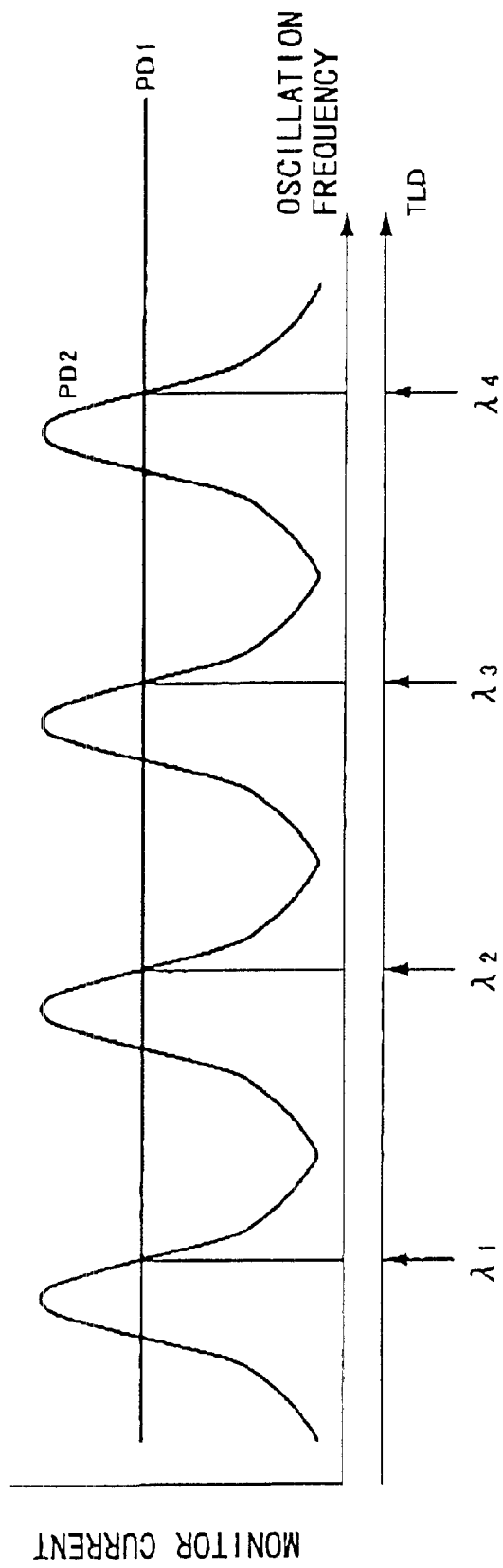
FIG. 12 is a graph illustrating a relationship between an oscillation wavelength and a monitor current output from a monitor photodiode.

A description will now be given, with reference to FIG. 12, of the monitor current output from the monitor PD 13 obtained when the optical filter 23 is formed of an etalon filter. FIG. 12 is a graph illustrating a relationship between the oscillation wavelength and the monitor current output from the monitor PD 13.

As shown in FIG. 12, the wavelength transmittance of the etalon filter appears periodically. Thus, the monitor current output from the monitor PD 13 has a characteristic as shown in FIG. 12. That is, by controlling the TEC element 14 to adjust the oscillation wavelength of the LD element 10, it is possible to lock the optical module at a plurality of oscillation frequencies $\lambda 1$ as shown in FIG. 12.

Figure 13:
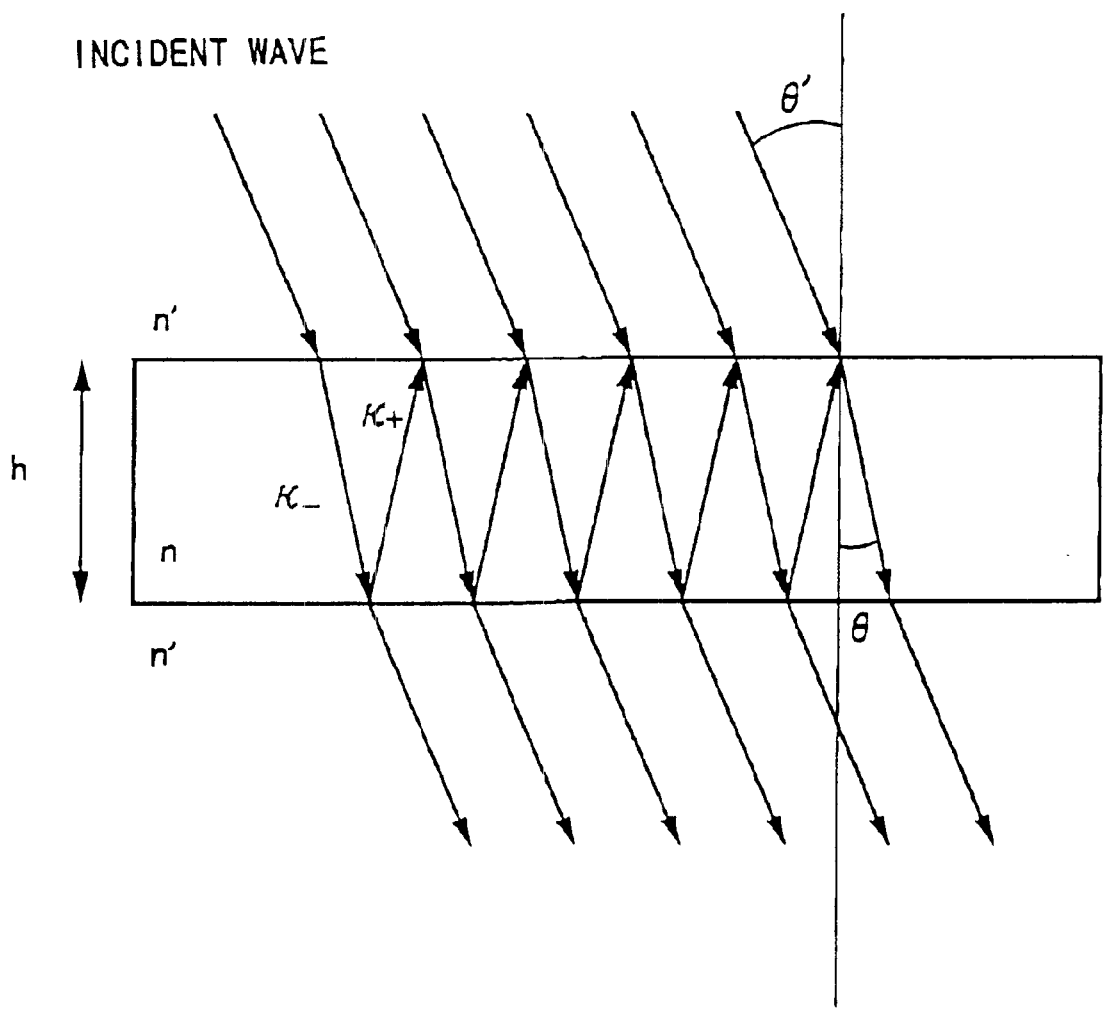
FIG. 13 is a diagram depicting the principle of an etalon filter.

A brief description will now be given, with reference to FIG. 13, of the principle of the etalon filter. In FIG. 13, a two-parallel-plane. plate having a refractive index n and a thickness h, is placed in a medium having a refractive index n'. The beams of a plane wave is incident to the upper plane at an angle θ'. The traveling light goes at an angle θ indicated by equation (1) below:

$$\theta = \sin^{-1}[(n'/n)\sin\theta'] \quad (1)$$

Then, a part of the traveling light is reflected by the lower plane, and goes upward. The light thus reflected is then reflected by the upper plane, and travels downward at the angle θ. As described above, the traveling light is repeatedly reflected by the lower and upper planes. Thus, an infinite number of light beams having the identical propagation angle results in the interference of multiple reflections. Let κ. and κ., be the wave vectors of the plane waves traveling downward and upward in the parallel-plane plate, the amplitudes of the plane waves are proportional to exp(−jκ.r) and exp(−jκ.r), and phase rotations caused during the time when the plane waves travel the length h are both equal to −nκ₀h cos θ. Thus, the plane waves make a single round travel with a phase rotation −φ represented by equation (2):

$$\phi = n\kappa_0 h \cos\theta \, (\kappa_0 = 2\pi/\lambda = \omega/c) \quad (2).$$

Let R and T be the transmittances of the parallel-plane plate or film obtained at the upper and lower interfaces with respect to light waves, the transmittance in the parallel-plane plate or film is represented by equation (3):

$$(\text{transmittance}) = -(1-R)^2/(1-R)_2 + 4\sin^2(\phi 2) \quad (3).$$

Thus, for φ=2n π, resonance occurs due to the phenomenon in which light wave components resulting from multiple reflections overlap with the same phase. This is no more than a filter characteristic. The frequency spacing FSR between consecutive peaks of the above filter characteristic is obtained from equation (4).

$$FSR = c/2nL \quad (4)$$

where c denotes the velocity of light and L denotes the thickness of etalon.

Figure 14:
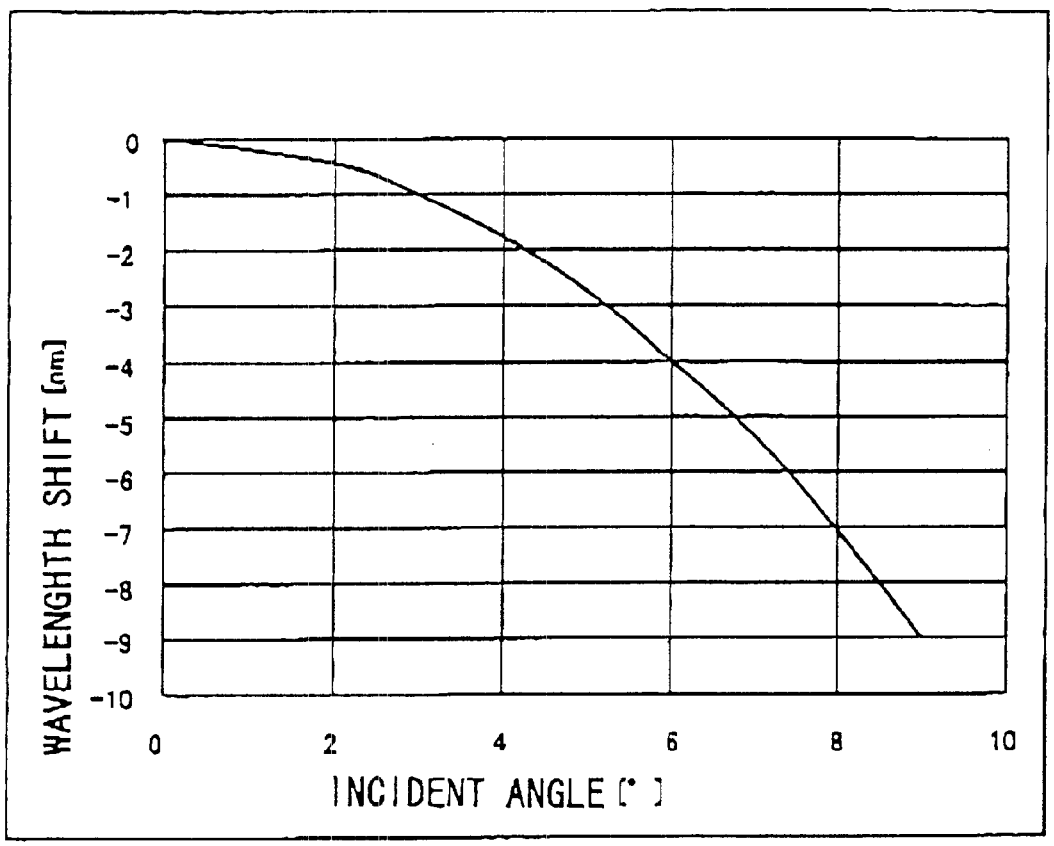
FIG. 14 is a graph of an incident-angle dependence of the etalon filter.

Turning to FIGS. 8 and 9, when the optical filter 23 is the etalon filter, the filter characteristic is changed as the incident angle of the light signal to the etalon filter varies, as shown in FIG. 14. FIG. 14 is a graph of an incident-angle dependence of the etalon filter. It can be seen from the graph of FIG. 14 that the peak of the etalon filter can be shifted by varying the incident angle of the light signal to the etalon filter.

For example, when the optical filter 23 of the optical module 3 is formed of an FSR −100 GHz etalon filter is used, there is a possibility that the oscillation wavelength of the LD element 10 may deviate from a desired locked frequency of the etalon filter by ±0.4 nm at maximum.

FIG. 15 shows a filter characteristic of the etalon filter with the incident angle equal to 0° and 3°. If the wavelength deviates by 1 nm with the incident angle of the light signal to the etalon filter being equal to 0°, it will be possible to lock the oscillation wavelength of the LD element 10 at the desired oscillation wavelength by setting the incident angle of the light signal to the etalon filter to 3°.

Thus, in order to realize the optical module 3 capable of changing the peak of the etalon filter by ±0.4 nm, it is sufficient to provide a configuration which can realize an incident angle variation of ±3.0°.

Similarly, when an etalon filter more than FSR-200 GHz is used, it is sufficient to provide a configuration which can realize an incident angle variation of ±4.0° in order to correct the maximum deviation of the oscillation wavelength of the LD element 10.

The light signal supplied to the monitor PD 13 of the optical module 3 is diffused light, and is thus absorbed partially by the monitor Pd 31 of the semi-transparent structure. Thus, only a very fine current may be output from the monitor Pd 13. Thus, the optical module 3 is required to have an arrangement in which the LD element 10 and the monitor PD 13 are located as close as possible and increase the transmittance of the monitor PD 31 up to the upper limit of the monitor current of the monitor PD 31. For example, it is desired that the LD element 10 and the monitor PD 13 are spaced apart from each other at a distance of 6 mm or less and the transmittance of the monitor PD 31 is equal to or greater than 50%.

The optical module 3 can be realized with a reduced number of components at a reduced cost.

Figure 16:
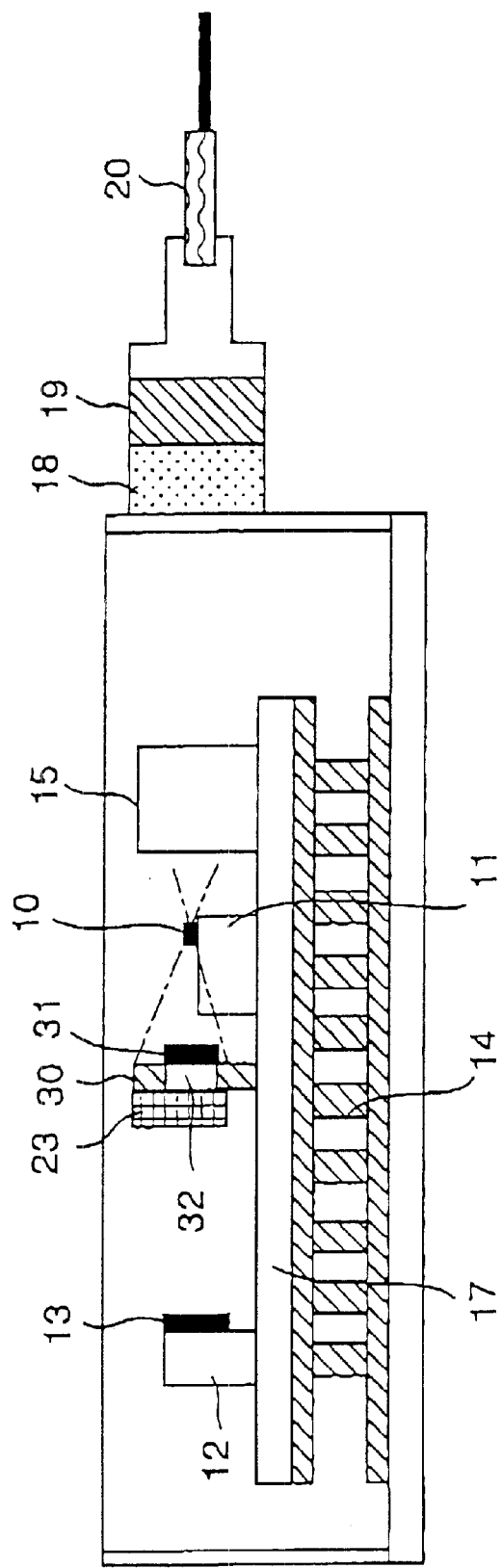
FIG. 16 is a side view of an optical module according to a second embodiment of the present invention.
Figure 17:
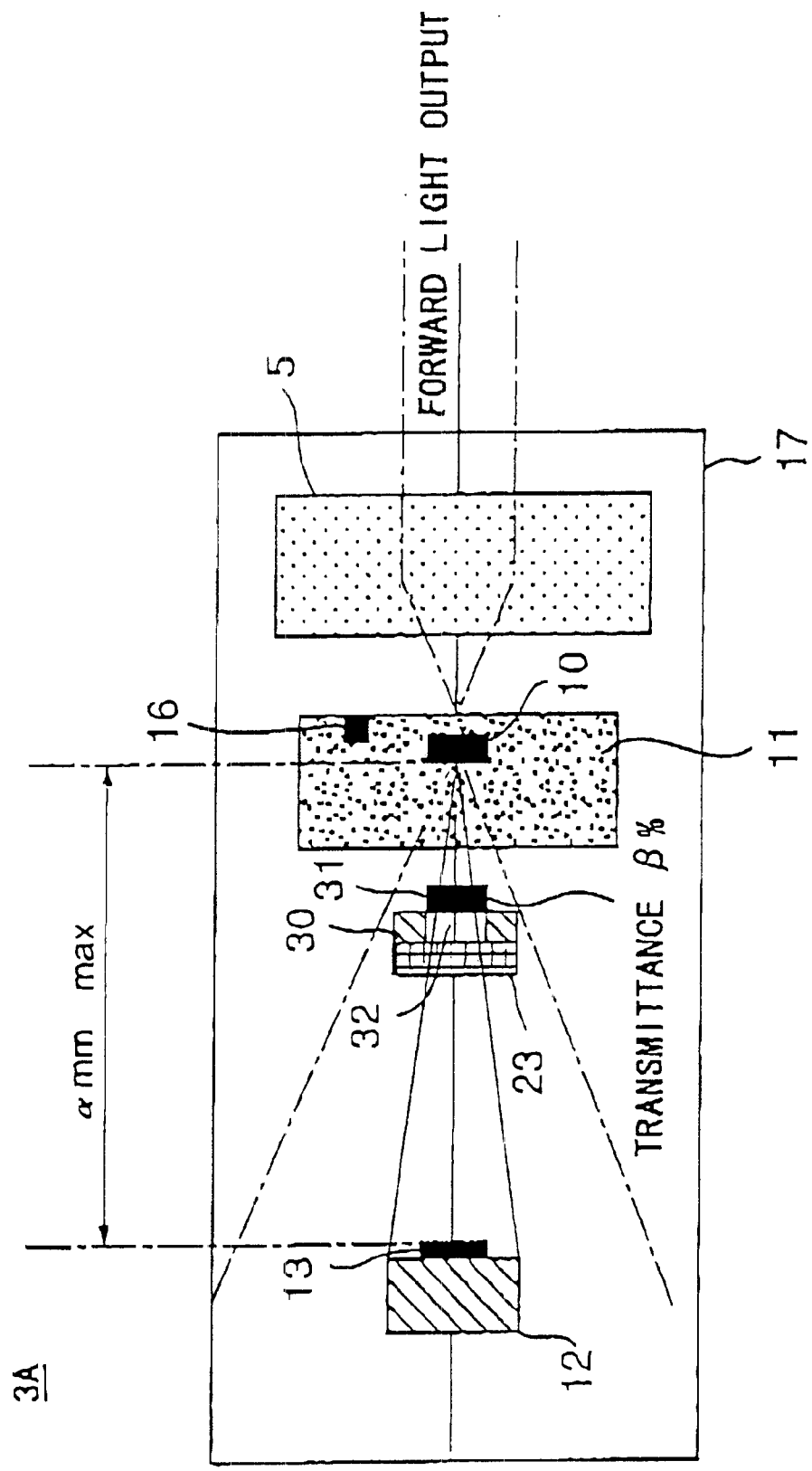
FIG. 17 is a top view of the optical module shown in FIG. 16.

A description will be given, with reference to FIGS. 16 and 17, of an optical module 3A according to a second embodiment of the present invention. FIG. 16 is a side view of the optical module 3A according to a second embodiment of the present invention. FIG. 17 is a top view of the optical module 3A. In FIGS. 16 and 17, parts that are the same as those shown in the previously described figures are given the same reference numbers.

The optical module 3 is designed so that the optical filter 23 is mounted on the PD carrier 30. More particularly, the optical filter 23 is mounted on a surface of the PD carrier 30 opposite to a surface thereof on which the monitor PD 31 of the semi-transparency structure is mounted. The optical filter 23 is located so as to hide the through hole 32 formed in the PD carrier 30.

The light signal emitted backward from the LD element 10 penetrates through the monitor PD 31 and passes through the hole 32, Then, the light signal reaches the optical filter 23. The above operation of the second embodiment of the present invention is the same as that of the first embodiment. However, the optical module 3A is capable of further reducing the distance between the monitor PD 31 and the optical filter 23. Thus, it is possible to further reduce the distance between the monitor PD 13 and the LD element 10.

Figure 18:
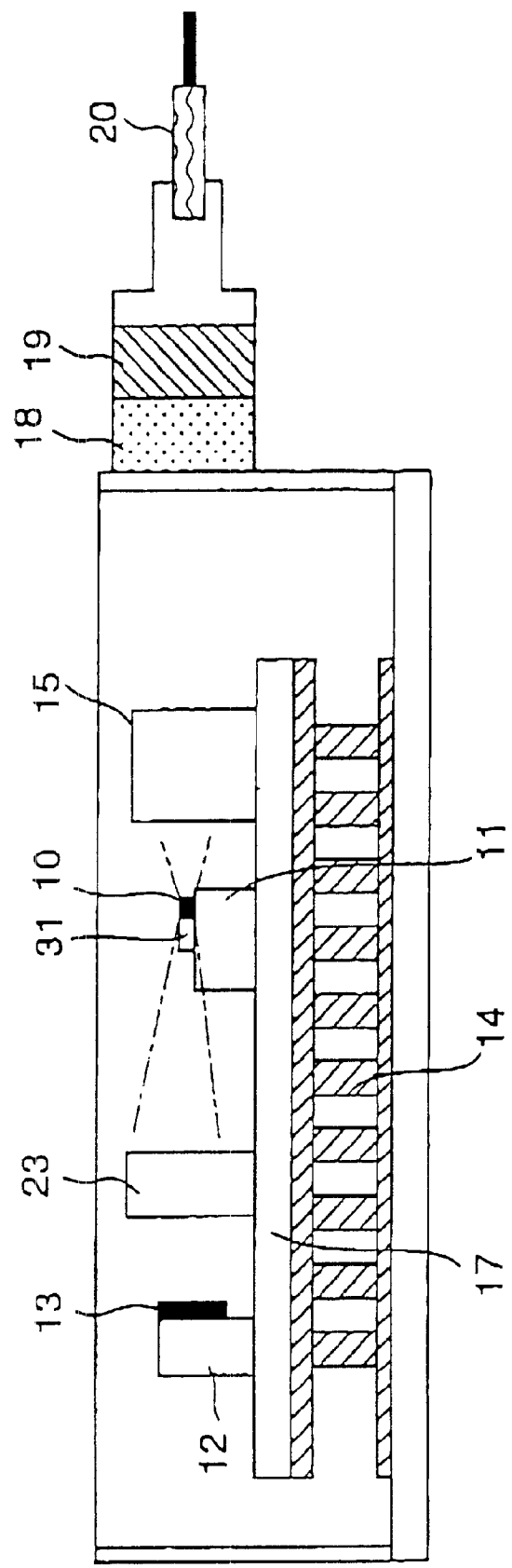
FIG. 18 is a side view of an optical module according to a third embodiment of the present invention.
Figure 19:
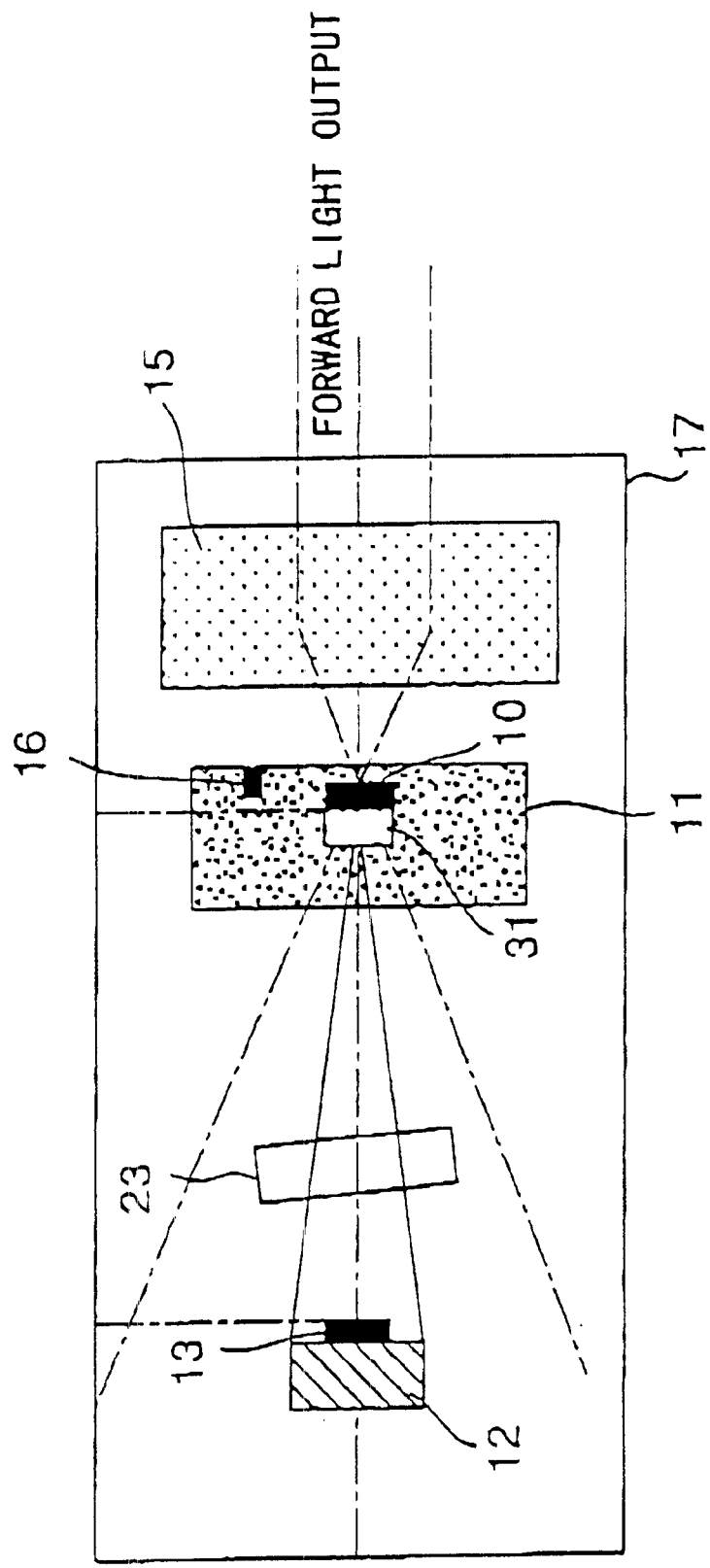
FIG. 19 is a top view of the optical module shown in FIG. 18.

FIG. 18 is a side view of an optical module 3B according to a third embodiment of the present invention. FIG. 19 is a top view of the optical module 3B. In FIGS. 18 and 19, parts that are the same as those shown in the previously described figures are given the same reference numbers.

The optical module 3B shown in FIGS. 18 and 19 has a unique arrangement in which the LD element 10 and the monitor PD 31 of the semi-transparent structure are integrated and mounted on the LD carrier 11. Originally, the LD element 10 and the monitor PD 31 are respectively semiconductor elements and are thus formed on the same substrate. The optical module 3B can be assembled by a further reduced number of components at a further reduced cost.

A description will be given of a tunable LD element which can be tuned to and locked at a plurality of oscillation frequencies by utilizing the etalon filter.

As has been described previously with reference to FIG. 10, the oscillation wavelength varies, when the operation temperature of the LD element 10 changes. Thus, it is possible to obtain the desired oscillation wavelength by adjusting the temperature of the periphery of the LD element 10.

When the temperature dependence of the oscillation wavelength is equal to 0.1 nm/° C., the 100 GHz WDM system has a wavelength spacing of 0.8 nm. That is, when the operation temperature of the LD element 10 is changed by 8° C., the operation frequency can be shifted to the adjacent wavelength.

When the optical filter 23 is formed of the etalon filter, the wavelength transmittance characteristic periodically appears in the monitor current output from the monitor PD 13, as has been described with reference to FIG. 12. When the oscillation wavelength is locked, it is desirable to utilize the maximum inclination of the graph of the wavelength transparency characteristic of FIG. 12. This is because the sharp slope makes it possible to precisely detect a waveform variation.

The locking of the oscillation wavelength to the maximum inclination portion of the graph in each peak can be adjusted by changing the incident angle of the light signal to the etalon filter, as has been described with reference to FIG. 14. The oscillation wavelength can be locked to either the right or left slope of each peak.

The filter characteristic of the etalon filter depends on a temperature variation in the refractive index of a substance used and a variation in the resonance length due to thermal expansion of the substance. A description will now be given, with reference to FIG. 20, of a temperature dependence of the filter characteristic of the etalon filter.

Figure 20:
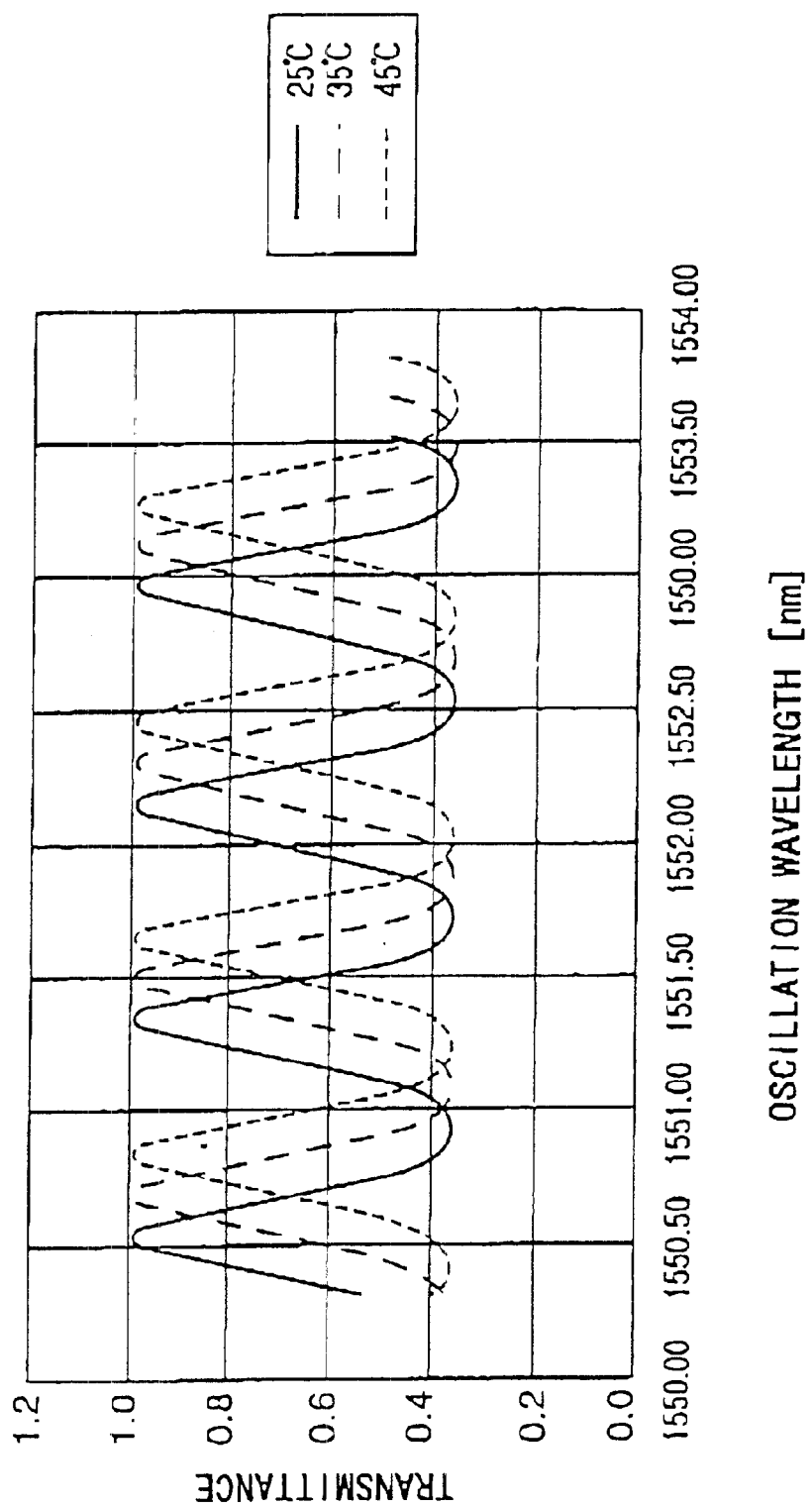
FIG. 20 is a graph of a temperature dependence of the filter characteristic.

Referring to FIG. 20, as the temperature rises, the peak wavelengths of the filter characteristic of the etalon filter moves to higher frequencies while the shapes of the peaks are maintained. The degree of the peak variation of the etalon filter depends on the material used, and is approximately equal to 8–22 pm/° C.

By the way, the optical modules 3, 3A and 3B of the first, second and third embodiments of the present invention has the arrangement in which the LD carrier 11 with the LD element 10 being mounted thereon and the optical filter 23 are mounted on the common TEC element 14. Thus, when the operation temperature of the LD element 10 is adjusted in order to obtain the desired oscillation wavelength, the operation temperature of the etalon filter is also changed, so that the peak wavelengths are varied.

Figure 21:
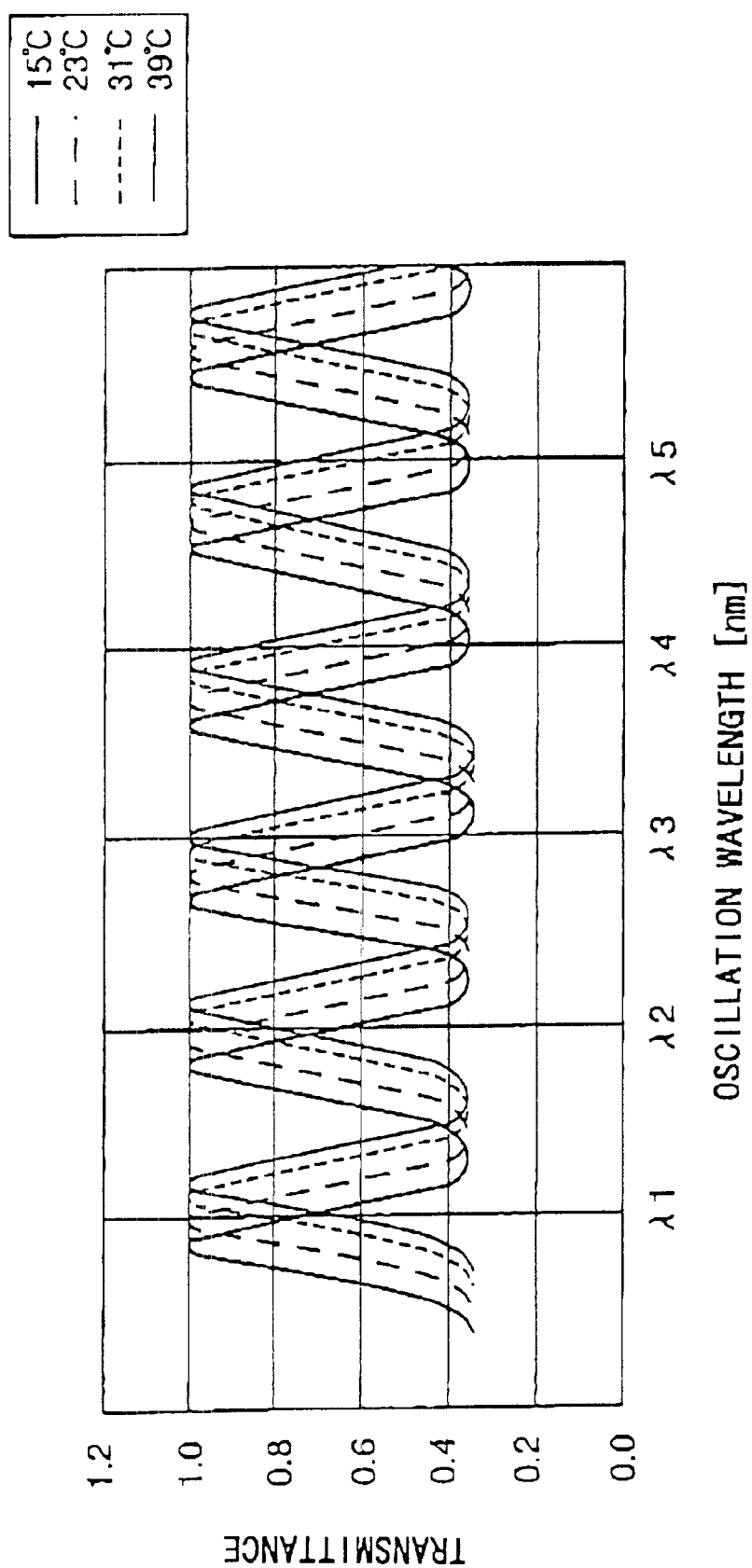
FIG. 21 shows a frequency spacing designed taking into consideration the temperature dependence of the filter characteristic.

It is thus required to design the frequency spacing FSR taking into account the temperature dependence of the filter characteristic. FIG. 21 shows the frequency spacing FSR designed taking into consideration the temperature dependence of the filter characteristic.

When the temperature dependence of the oscillation wavelength of the LD element 10 is equal to 0.1 nm/°C., the oscillation frequency can be moved to the neighboring wavelength by changing the operation frequency by 8° C. If the operation temperature at which the oscillation wavelength can be locked at wavelength λ1 is 15° C., the operation temperature at which the oscillation frequency can be locked at wavelength λ2 is 15° C. Similarly, the operation temperatures at which the oscillation frequency can be locked at wavelengths λ3 and λ4 are respectively 31° C. and 39° C.

Thus, the frequency spacing FSR of the etalon filter is designed to adjust a WDM pitch of 100 GHz (approximately 0.8 nm) by 8° C.×(temperature dependence of the etalon filter (for example, 0.1 nm/°C.)). In other words, the frequency spacing FSR of the etalon filter corresponds to 100 GHz (approximately 0.8 nm)±8° C.×(temperature dependence of the etalon filter (for example. 0.1 nm/° C.)).

When the optical filter 23 is mounted on another TEC element separate from the TEC element on which the LD carrier 11 supported by the LD element 10 is mounted, it is possible to separately adjust the operation temperature of the LD element 10 and that of the optical filter 23.

Figure 1:
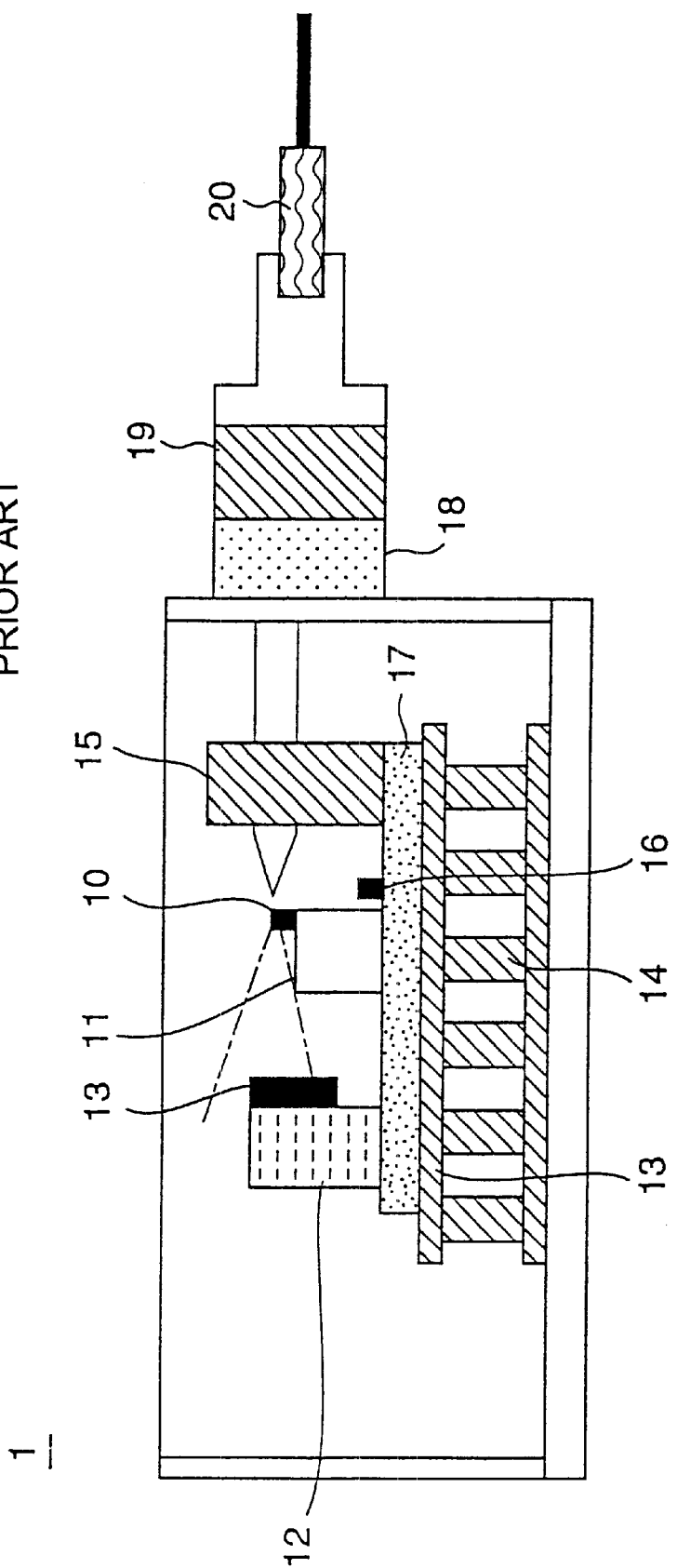
FIG. 1 is a side view of a conventional optical module.
Figure 2:
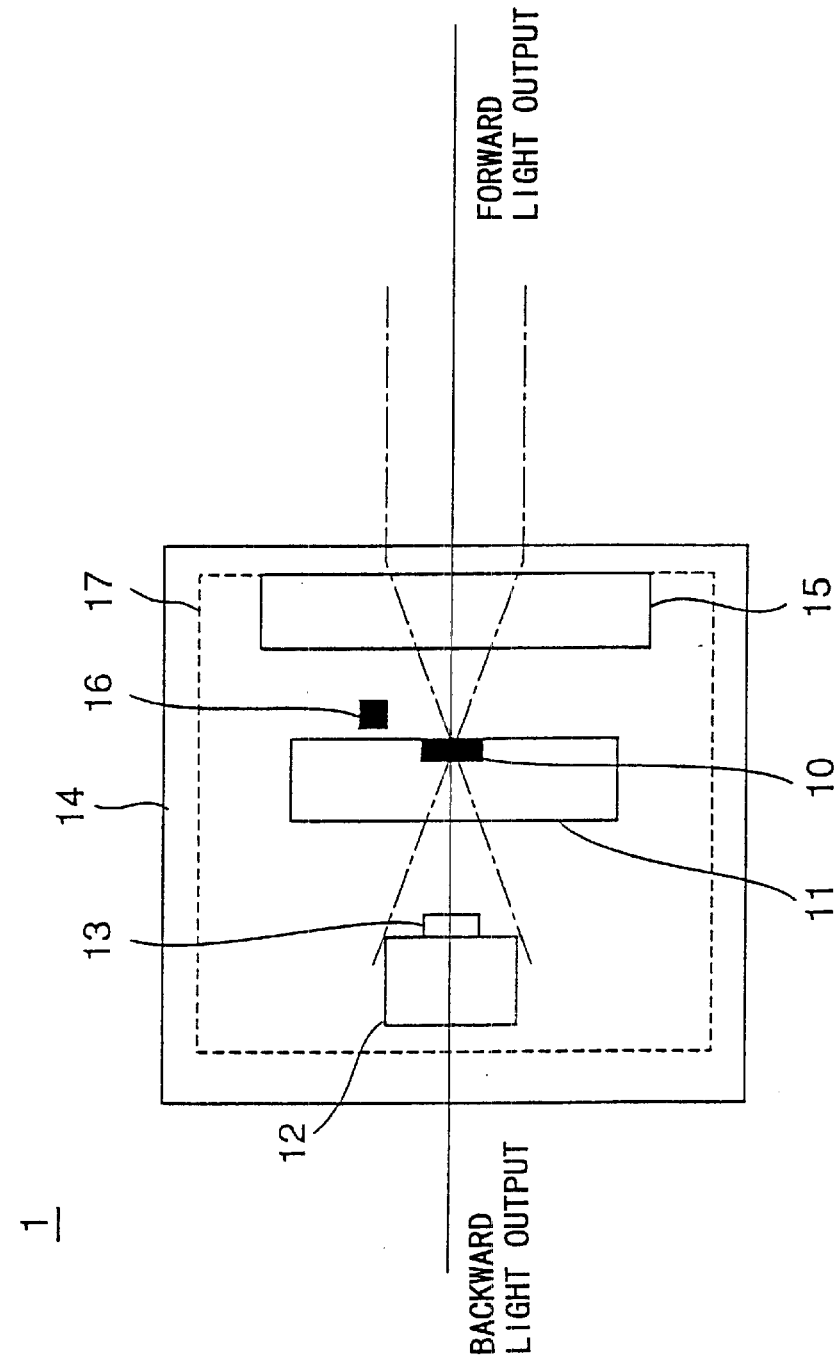
FIG. 2 is a top view of the conventional optical module shown in FIG. 1.
Figure 3:
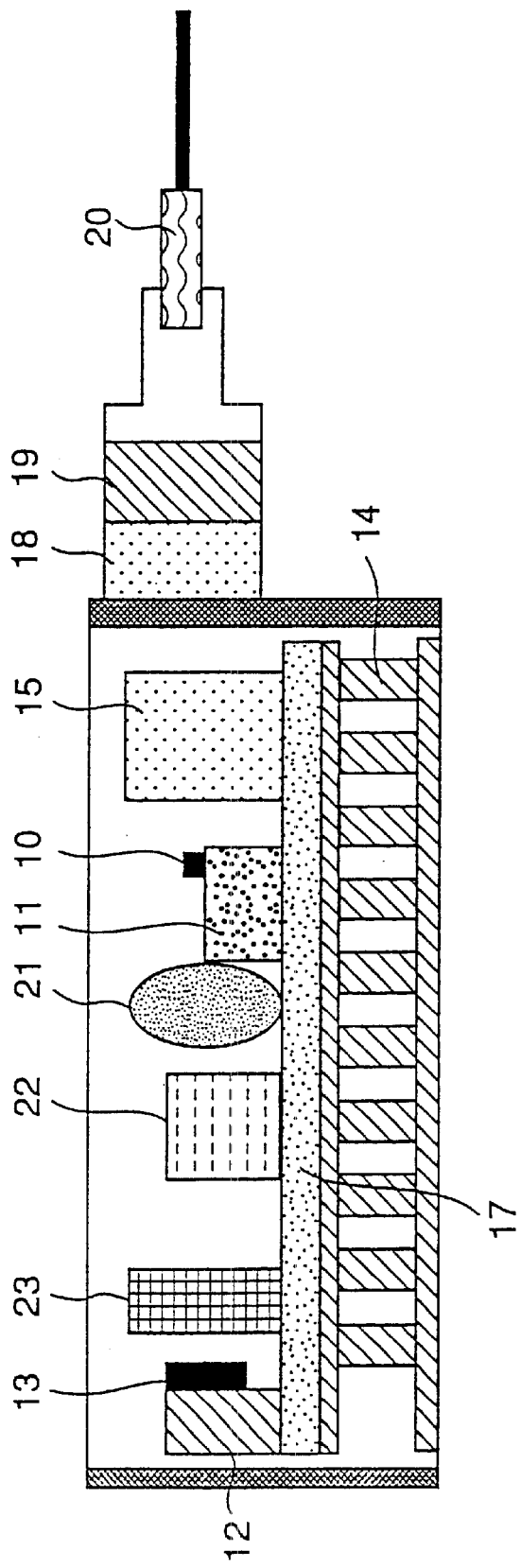
FIG. 3 is a side view of another conventional optical module.
Figure 4:
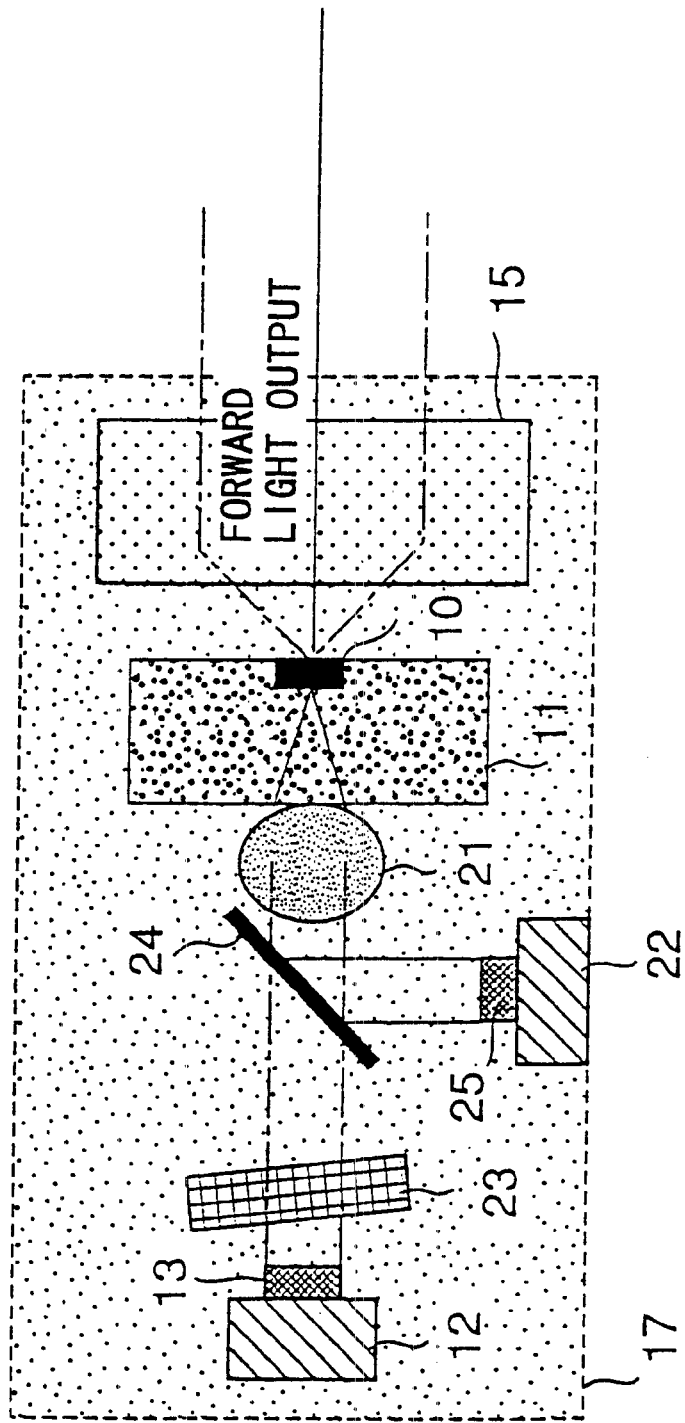
FIG. 4 is a top view of the conventional optical module, shown in FIG. 3.
Figure 22:
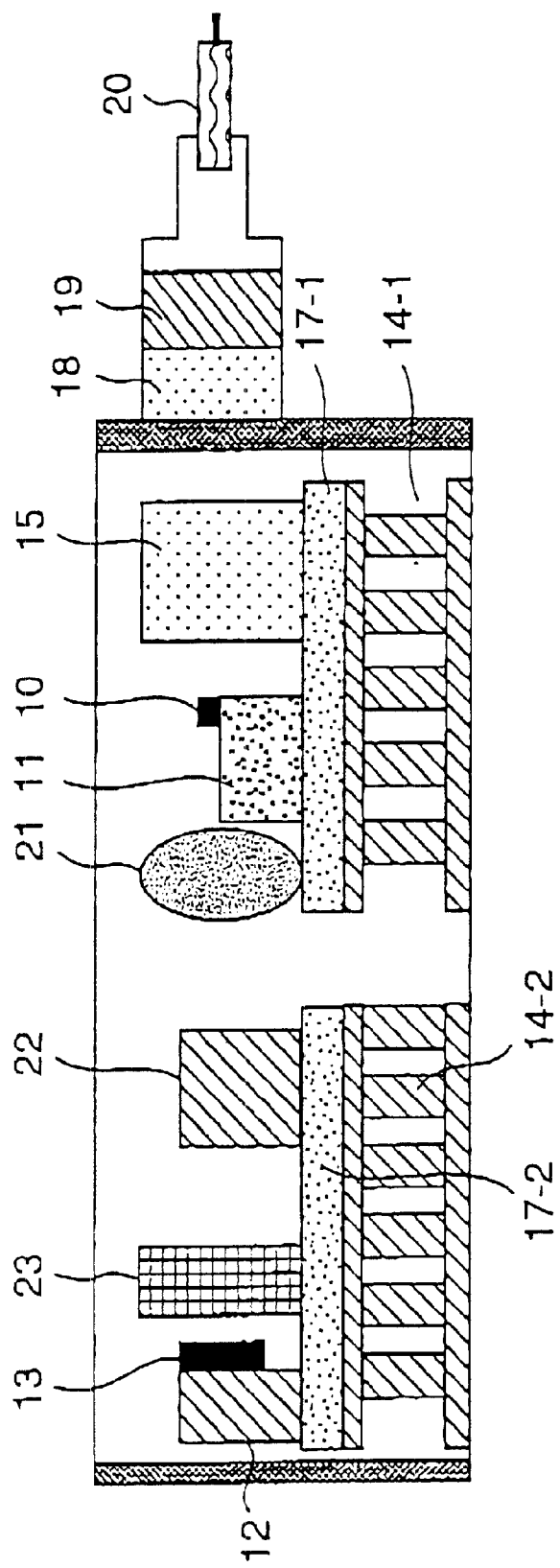
FIG. 22 is a side view of an optical module according to a fourth embodiment of the present invention.
Figure 23:
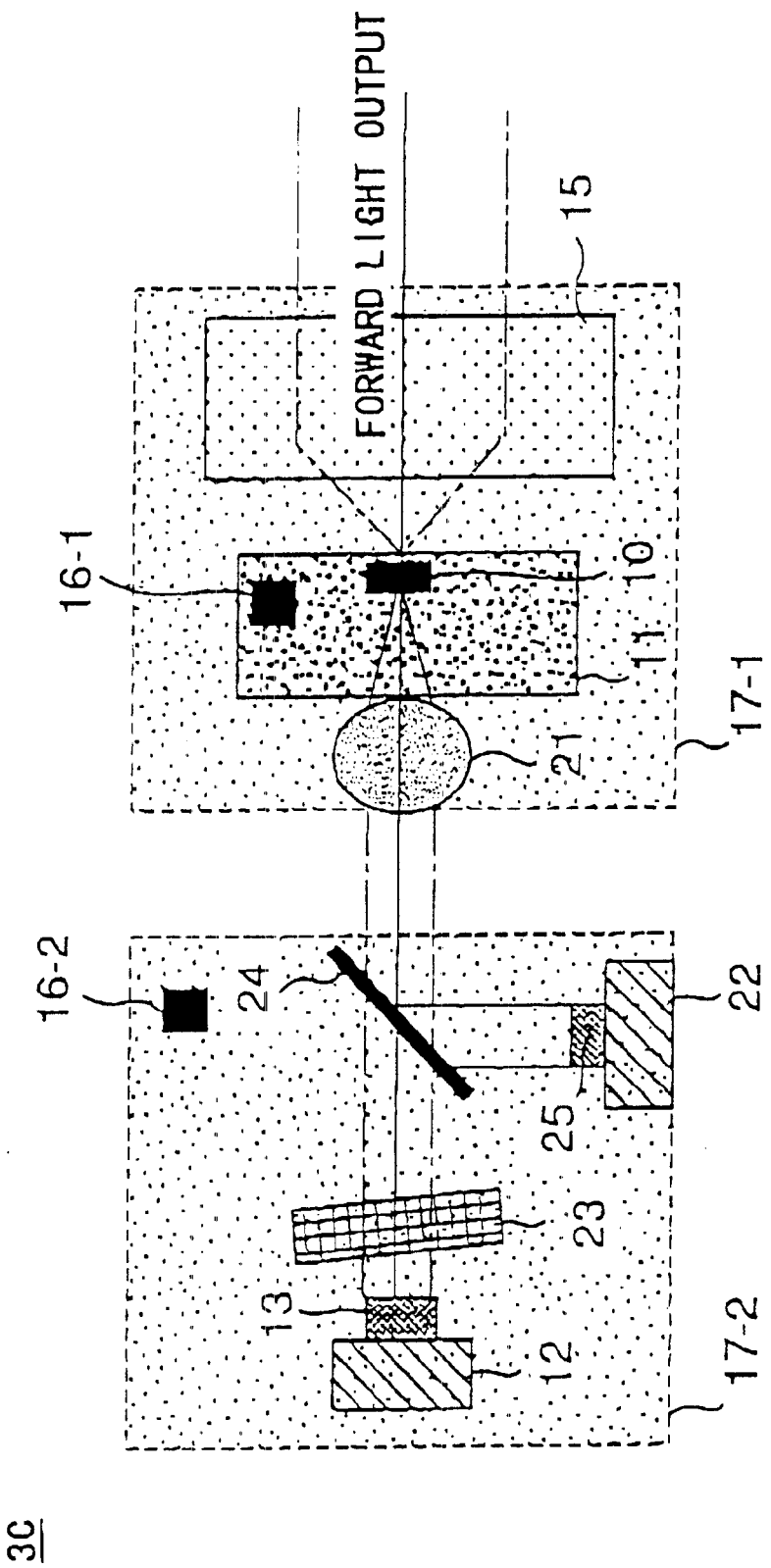
FIG. 23 is a top view of the optical module shown in FIG. 22.

FIG. 22 is a side view of an optical module 3C according to a fourth embodiment of the present invention. FIG. 23 is a tope view of the optical module 3C. The optical module 3C is the same as the optical module 3 shown in FIGS. 3 and 4 except for some parts. In FIGS. 22 and 23, parts that are the same as those shown in the previously described figures are given the same reference numbers.

The optical module 3C includes the LD element 10, the LD carrier 11, the PD carrier 12, the monitor PD 13, a TEC element 14-1, a TEC element 14-2, the first lens 15, a mount carrier 17-1, a mount carrier 17-2, the optical isolator 18, the second lens 19, the back lens 21, the PD carrier 22, the optical isolator 23, the beam splitter 24, and the monitor PD 25.

The mount carrier 17-1 is mounted on the TEC element 14-1. The LD carrier 11 with the LD element 10 being mounted thereon, the first lens 15, and the back lens 21 are mounted on the mount carrier 17-1. The mount carrier 17-2 is mounted on the TEC element 14-2. On the mount carrier 17-2, mounted are the PD carrier 12 with the monitor PD 13 being mounted thereon, the optical filter 23, the PD carrier 22 with the monitor PD 25 being mounted thereon, and the beam splitter 24.

A thermistor 16-1 is mounted on the LD carrier 11, and monitors the temperature of the periphery thereof. A thermistor 16-2 is mounted on the mount carrier 17-2, and monitors the temperature of the periphery thereof. Thus, it is possible to separately monitor the operation temperatures of the LD element 10 and the optical filter 23.

The temperature characteristic of the etalon filter is designed as follows Let A° C., B nm/° C., and C nm be respectively the variable temperature range of the TEC element 14-2 on which the etalon filter is mounted, the temperature characteristic of the etalon filter, and the frequency spacing FSR of the etalon filter. When the oscillation wavelength is locked at one of the two inclined portions of the wavelength transmittance characteristic, if following equation (5) stands, wavelength control over the frequency spacing FSR can be achieved by adjusting the operation temperature of the etalon filter:

$$A \times B \geq C \qquad (5).$$

When the oscillation wavelength is locked at both the inclined portions of the wavelength transmittance characteristic, if following equation (6) stands, wavelength control over the frequency spacing FSR can be achieved by adjusting the operation temperature of the etalon filter.

$$A \times B \geq C/2 \qquad (6).$$

More particularly, in a case where the FSR of the etalon filter is 100 GHz (approximately 800 pm) and the TEC element 14-2 on which the etalon filter is mounted has a variable temperature range of 10–65° C., the temperature characteristic of the etalon filter that can be locked at any wavelength is 14.5 pm/° C. when the oscillation wavelength is locked at one of the two inclined portions of the wavelength transmittance characteristic graph, and is 7.2 pm/° C. when the oscillation wavelength is locked at both the inclined portions thereof.

Thus, by selecting the substance of the etalon filter so that the above-mentioned temperature characteristic, it is possible to realize the optical module that can be locked at any wavelength.

In FIGS. 22 and 23, the light signal emitted from the LD element 10 can be locked at a desired oscillation wavelength by adjusting the operation temperature of the LD element 10 by utilizing the TEC element 14-1. The temperature characteristic of the etalon filter is designed so that a desired oscillation wavelength is locked at, for example, one of the inclined portions of the graph by adjusting the operation temperature of the etalon filter by means of the TEC element 14-2.

Figure 24:
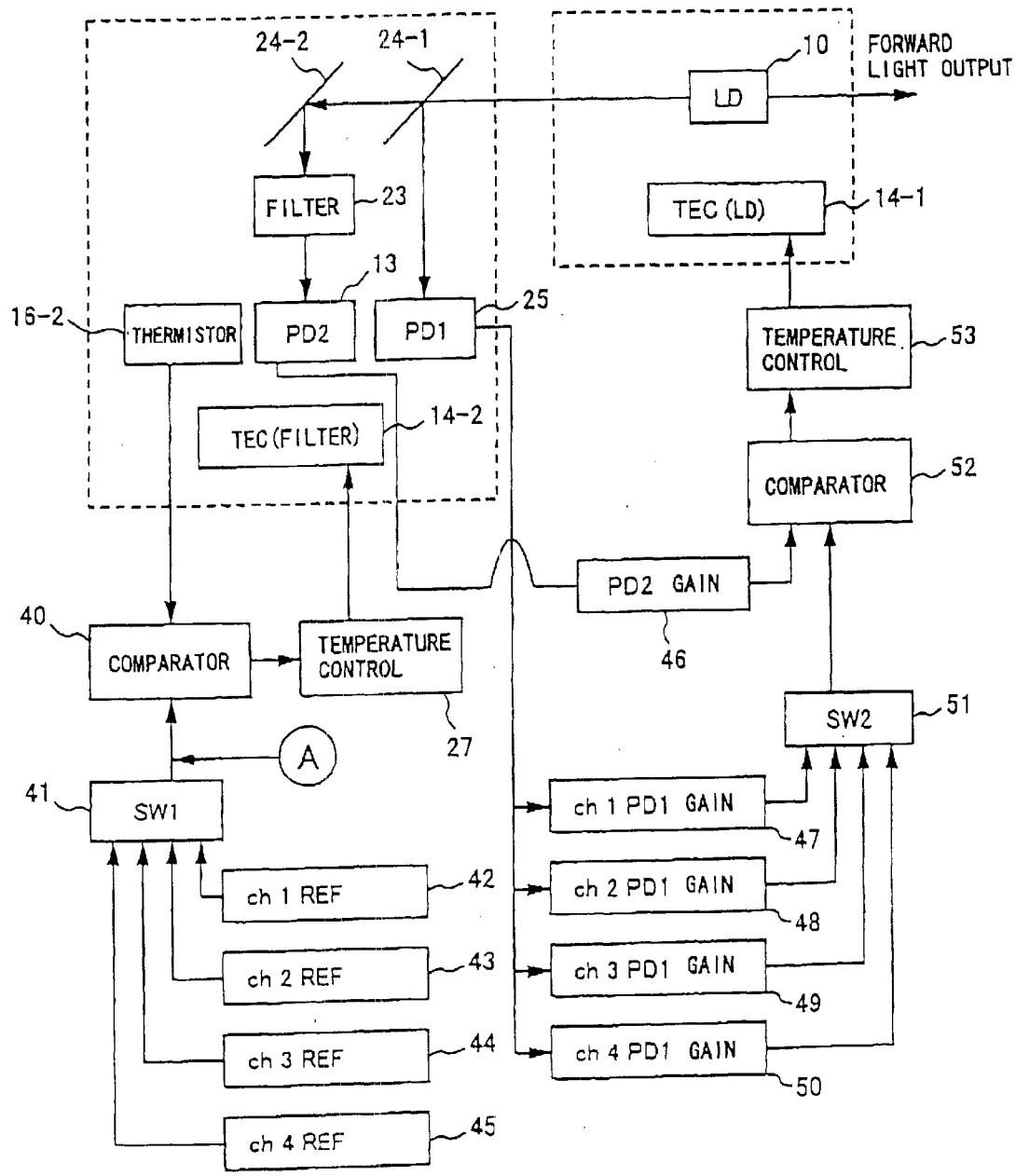
FIG. 24 is a block diagram of a control system for implementing the wavelength fixing control method.

FIG. 24 is a block diagram of a control system for implementing the above-mentioned wavelength fixing control method. In FIG. 24, parts that are the same as those shown in the previously described figures are given the same reference numbers. First, the operation temperature of the etalon filter is set for every desired oscillation wavelength. Thermistor resistance values (reference values) corresponding to the operation temperatures for the respective desired oscillation wavelengths are stored in registers 42–45 (ch1REF–ch4REF). A switch 41 selects one of the registers 42–45 corresponding to a selected one of the desired oscillation wavelengths. The selected desired oscillation wavelength is then supplied to a comparator circuit 40.

The comparator circuit 40 compares the thermistor resistance value supplied via the switch 41 with the thermistor resistance value obtained from the thermistor 16-2. The temperature control circuit 27 controls the TEC element 14-2 based on comparison results to control the operation temperature of the etalon filter.

The monitor current output from the monitor PD 13 is amplified by an amplifier circuit 46, and is then supplied to a comparator circuit 52. The monitor current output from the monitor PD 25 is supplied to amplifier circuits 47–50, which have respective gains with which the desired oscillation wavelengths can be obtained for the respective channels. For example, the amplifier circuit 47 is involved in channel 1 (ch1), and has a gain which achieves the desired oscillation wavelength for channel 1. A switch 51 selects one of the amplifier circuits 47–50, and supplies the output signal of the selected amplifier circuit to the comparator circuit 52.

The comparator circuit 52 compares the monitor current supplied via the amplifier circuit 46 with the monitor current supplied via the switch 51. Based on the comparison results, the temperature control circuit 53 controls the TEC element 14-1 to adjust the operation temperature of the LD element 10.

Figure 25:
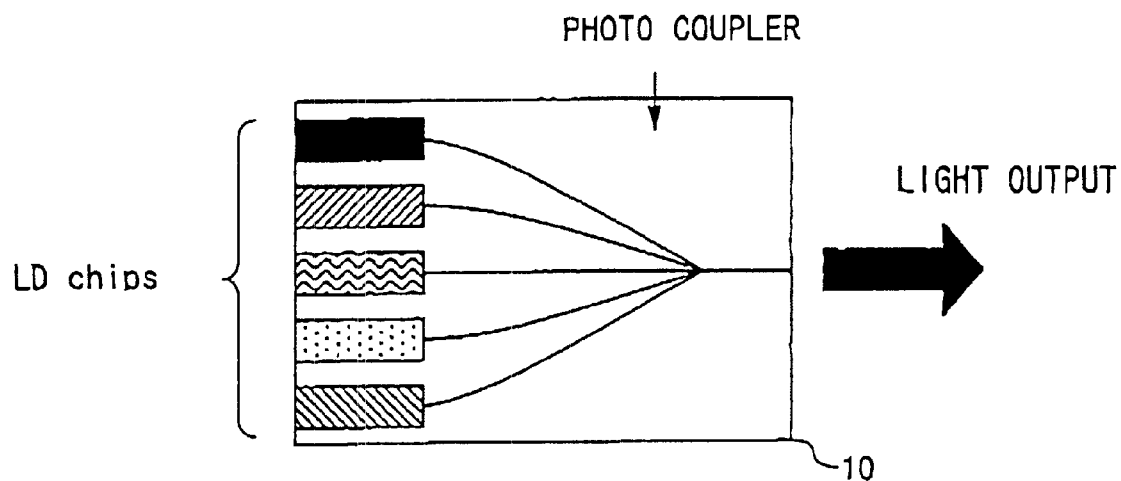
FIG. 25 is a diagram of an array-type LD element having an array of laser diode chips.
Figure 26:
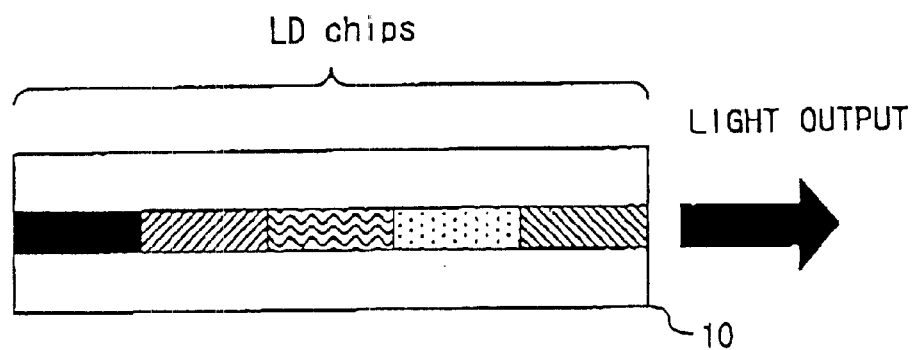
FIG. 26 is a diagram of a tandem-type LD element having a tandem alignment of laser diode chips.

As has been described, it is possible to realize the optical module that can be locked at any wavelength by adjusting the operation temperature of the etalon filter. Thus, the present invention can be applied to optical modules using LD elements as shown in FIGS. 25 and 26, The LD element shown in FIG. 25 has an array of n LD chips and a photocoupler, The LD element shown in FIG. 26 has a tandem alignment of n LD chips.

The optical modules of the first through fourth embodiments of the present invention adjust the oscillation wavelength by utilizing the light signal emitted backward from the LD element 10. Alternatively, it is possible to utilize the light signal emitted forward from the LD element 10.

Figure 27:
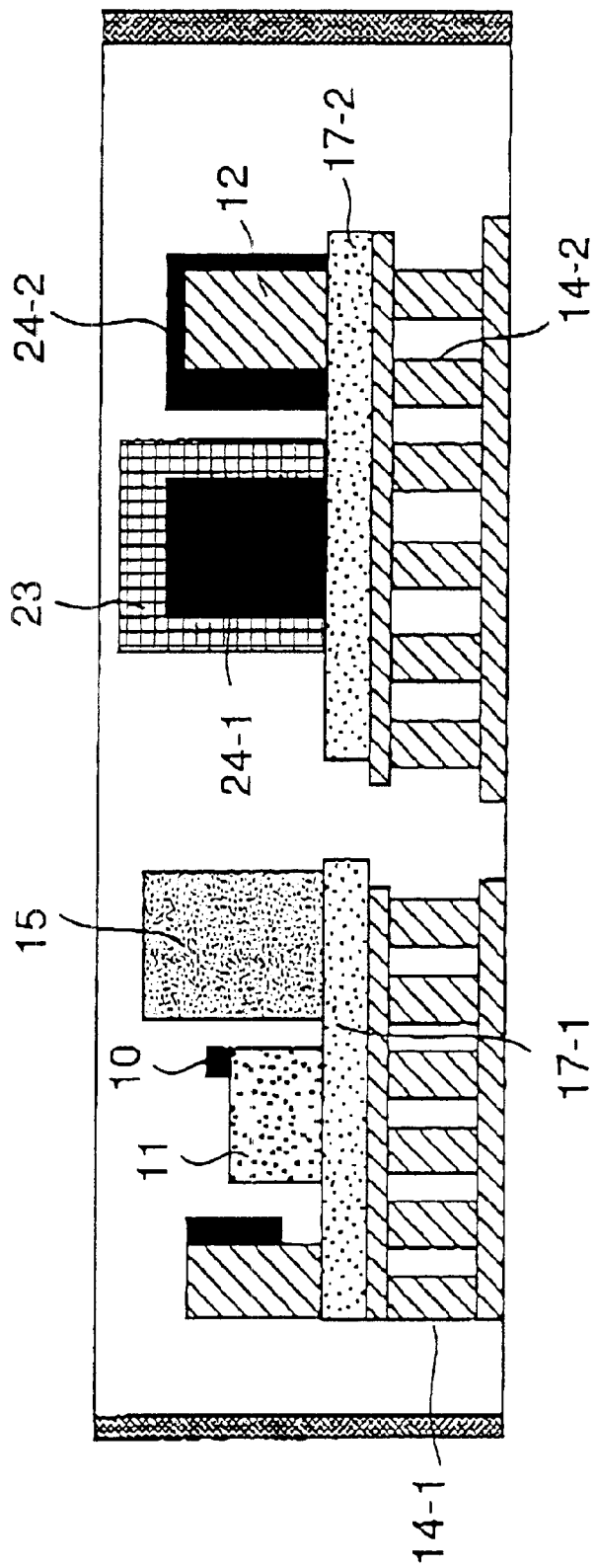
FIG. 27 is a side view of an optical module according to a fifth embodiment of the present invention.
Figure 28:
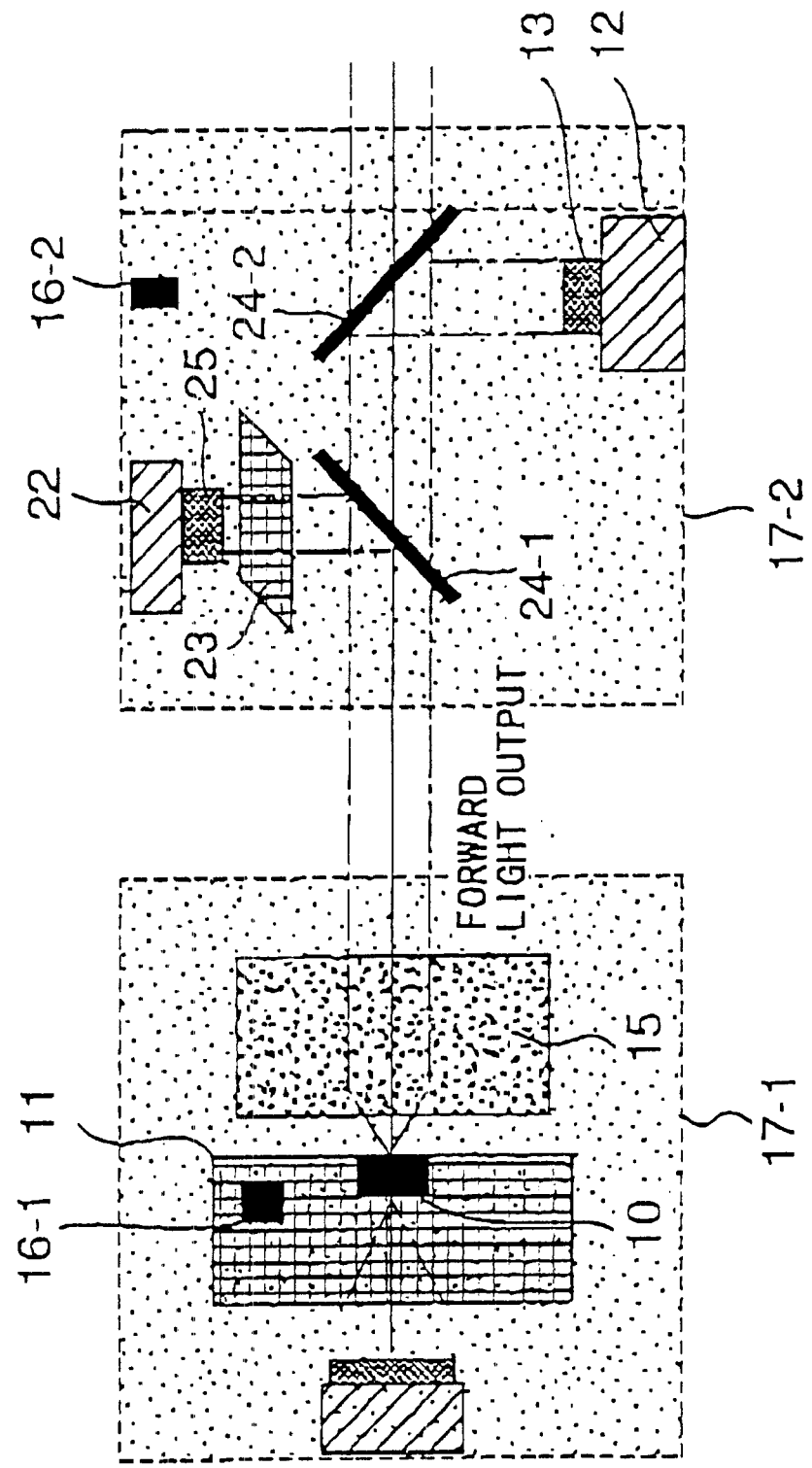
FIG. 28 is a top view of the optical module shown in FIG. 27.

FIG. 27 is a side view of an optical module 3D according to a fifth embodiment of the present invention. FIG. 28 is a top view of the optical module 3D. In FIGS. 27 and 28, parts that are the same as those shown in the previously described figures are given the same reference numbers. The light signal emitted forward is split by the beam splitters 24-1 and 24-2. The light signals from the beam splitters 24-1 and 24-2 respectively arrive at the monitor PD 25 mounted on the PD carrier 22 and the monitor PD 13 mounted on the PD carrier 12. The other parts of the fifth embodiment of the present invention are the same as those of the fourth embodiment thereof.

Figure 29:
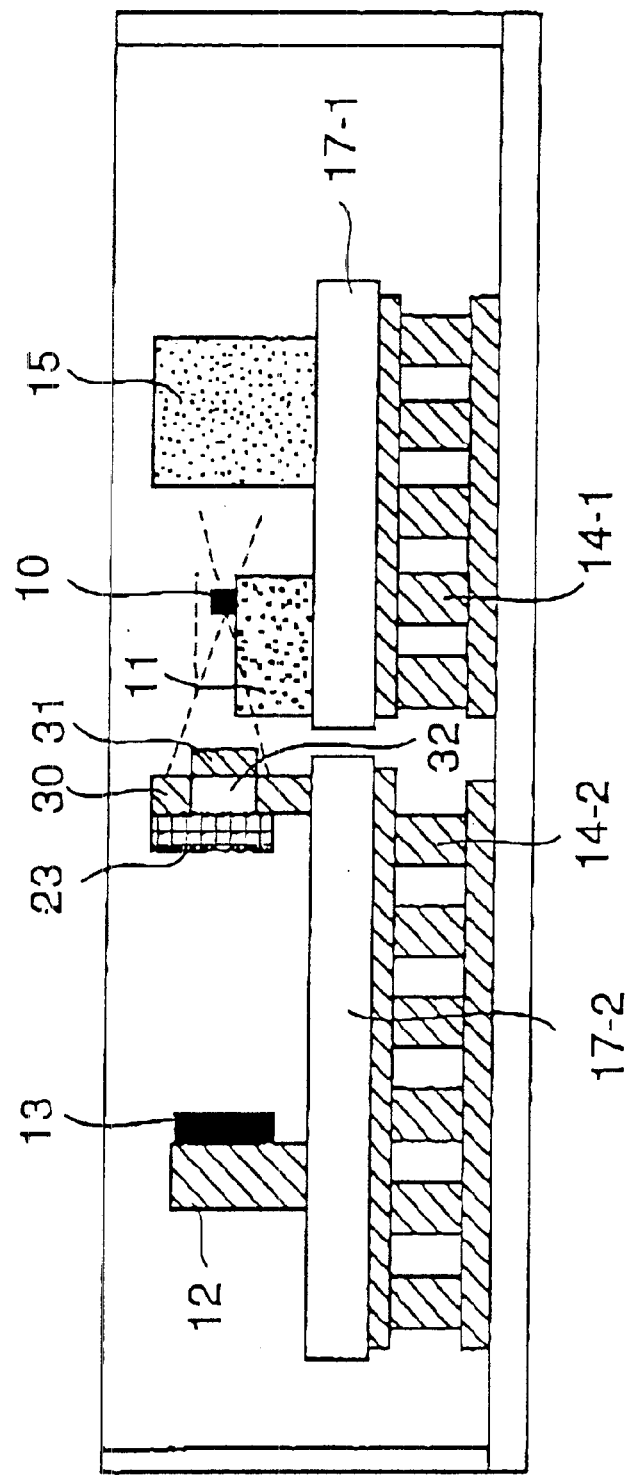
FIG. 29 is a side view of an optical module according to a sixth embodiment of the present invention.
Figure 30:
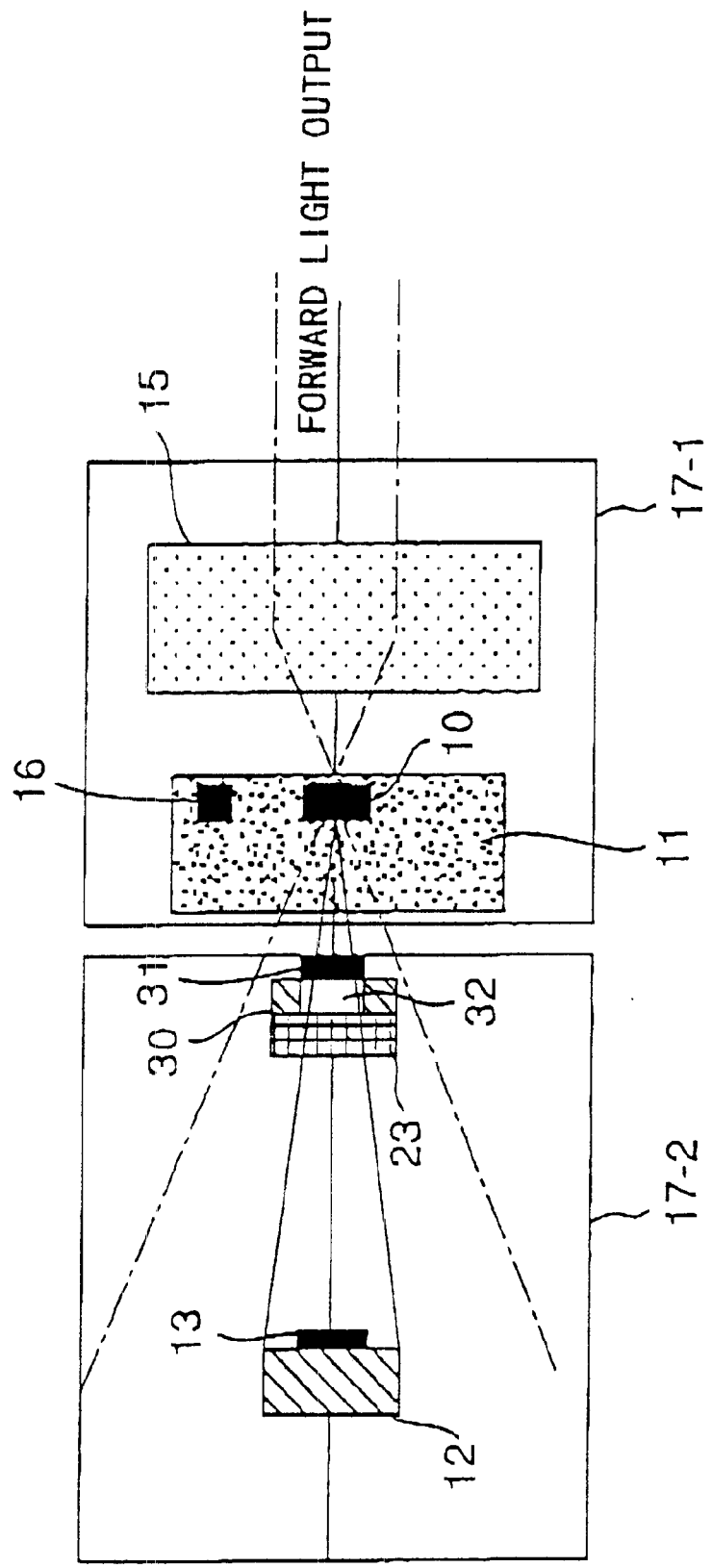
FIG. 30 is a top view of the optical module shown in FIG. 29.

FIG. 29 is a side view of an optical module 3E according to a sixth embodiment of the present invention. FIG. 30 is a top view of the optical module 3E. In FIGS. 29 and 30, parts that are the same as those shown in the previously described figures are given the same reference numbers. The TEC element 14 and the mount carrier 14 shown in FIG. 16 are divided into two parts. With this structure, it is possible to separately control the operation temperature of the LD element 10 and the operation temperature of the filter 23. The other parts of the optical module 3E are the same as those of the previously described embodiments of the present invention.

The present invention is not limited to the specifically described embodiments, and variations and modifications may be made without departing from the scope of the present invention.

What is claimed is:

1. An optical module comprising:
    a light-emitting element capable of varying an oscillation wavelength of the light output thereof by adjusting an operation temperature;
    a splitter splitting a light signal emitted from the light-emitting element;
    a first level detecting part receiving a first split light signal from the splitter;
    a second level detecting part receiving a second split light signal from the splitter via an optical filter;
    a first control part controlling the operation temperature of the light-emitting element in accordance with first and second electric signals output from the first and second level detecting parts, respectively; and
    a second control part controlling an operation temperature of the optical filter thereby to adjust a current oscillation wavelength of the light-emitting element to a desired oscillation wavelength, by detecting a current operating temperature of the optical filter, accessing a storage of plural reference values respectively corresponding to plural different operation temperatures of the optical filter set for respective, different oscillation wavelengths of the light-emitting element, selecting the respective reference operation temperature value corresponding to the desired oscillation wavelength and comparing the current operation temperature value with the selected reference operation temperature value so as to adjust the current operation temperature to the desired operation temperature.

2. The optical module as claimed in claim 1, wherein the optical filter attenuates the second split light signal in accordance with a given filter characteristic, and an attenuated second light signal is received by the second level detecting part.

3. The optical module as claimed in claim 2, wherein the given filter characteristic of the optical filter depends on an incident angle of the first split light signal.

4. The optical module as claimed in claim 1, wherein the control part comprises:
    a comparator comparing the electric signals from the first and second level detecting parts with each other; and
    a temperature control part controlling the operation temperature of the light-emitting element on the basis of comparison results whereby adjusting a wavelength of the light signal from the light-emitting element.

5. An optical module comprising:
    a light-emitting element capable of varying an oscillation wavelength based on an operation temperature;
    a splitter splitting a light signal emitted from the light-emitting element;

a first level detecting part receiving a first split light signal from the splitter;

a second level detecting part receiving a second split light signal from the splitter via an optical filter;

a first control part controlling the operation temperature of the light-emitting element in accordance with electric signals output from the first and second level detecting parts; and a second control part controlling an operation temperature of the optical filter in accordance with the oscillation wavelength of the light-emitting element, wherein the second control part comprises:

a temperature detecting part detecting the operation temperature of the optical filter;

a reference value outputting part from which reference values corresponding to operation temperatures set to respective oscillation wavelengths of the light-emitting element are output;

a comparator comparing a value corresponding to the operation temperature output from the temperature detecting part with one of the reference values from the reference value outputting part; and a second temperature control part controlling the operation temperature of the optical filter based on comparison results.

6. The optical module as claimed in claim 1, wherein the light-emitting element includes an array of laser diodes.

7. The optical module as claimed in claim 5, wherein the light-emitting element includes a tandem alignment of laser diodes.

8. The optical module as claimed in claim 1, wherein the light-emitting element includes a tandem alignment of laser diodes.

9. The optical module as claimed in claim 1, wherein the optical filter is an etalon filter.

10. An optical module comprising:

a light-emitting element;

a first temperature control part controlling a temperature of the light-emitting element;

a first light receiving part receiving a light from the light-emitting element;

a second light receiving part receiving the light from the light-emitting element via an optical filter; and a second temperature control part controlling a temperature of the optical filter, wherein:

the first light-receiving part includes a light receiving element having a semi-transparent structure; and the optical filter filters the light from the first light receiving part, so that a filtered light is applied to the second light receiving part.

11. The optical module as claimed in claim 10, wherein the optical filter is a Fabry-Perot etalon filter.

12. The optical module as claimed in claim 10, wherein temperature sensing elements are respectively mounted on the first and second temperature control parts.

13. The optical module as claimed in claim 10, further comprising:

a first splitter by which the light from the light-emitting element goes toward the first light receiving part; and a second splitter by which the light from the light-emitting element goes toward the second light receiving part.

14. An optical module comprising:

a light-emitting element capable of varying an oscillation wavelength of a light signal emitted from the light-emitting element;

a splitter splitting the light signal emitted from the light-emitting element;

a first level detecting part receiving a first split light signal from the splitter;

an optical filter;

a second level detecting part receiving a second split light signal from the splitter via the optical filter;

a first control part controlling the oscillation wavelength of the light-emitting element in accordance with respective first and second electric signals output from the first and second level detecting parts, respectively; and a second control part controlling an operation temperature of the optical filter thereby to adjust a current oscillation wavelength of the light-emitting element to a desired oscillation wavelength, by detecting a current operating temperature of the optical filter, accessing a storage of plural reference values respectively corresponding to plural different operation temperatures of the optical filter set for respective, different oscillation wavelengths of the light-emitting element, selecting the respective reference operation temperature value corresponding to the desired oscillation wavelength and comparing the current operation temperature value with the selected reference operation temperature value so as to adjust the current operation temperature to the desired operation temperature.

15. The optical module as claimed in claim 14, wherein the optical filter attenuates the second split light signal in accordance with a given filter characteristic, and an attenuated second light signal is received by the second level detecting part.

16. The optical module as claimed in claim 15, wherein the given filter characteristic of the optical filter depends on an incident angle of the first split light signal.

17. The optical module as claimed in claim 14, wherein the second control part comprises:

a comparator comparing the electric signals from the first and second level detecting parts with each other; and a temperature control part controlling the operation temperature of the light-emitting element on the basis of the comparison results whereby adjusting a wavelength of the light signal emitted from the light-emitting element.

18. An optical module comprising:

a light-emitting element capable of varying an oscillation wavelength of light signal emitted from the light-emitting element;

a splitter splitting the light signal emitted from the light-emitting element;

a first level detecting part receiving a first split light signal from the splitter;

an optical filter;

a second level detecting part receiving a second split light signal from the splitter via the optical filter;

a first control part controlling the oscillation wavelength of the light-emitting element in accordance with electric signals output from the first and second level detecting parts; and a second control part controlling an operation temperature of the optical filter in accordance with the oscillation wavelength of the light-emitting element, wherein the second control part comprises:

a temperature detecting part detecting the operation temperature of the optical filter;

a reference value outputting part from which reference values corresponding to operation temperatures set for respective oscillation wavelengths of the light-emitting element are output;

a comparator comparing a value corresponding to the operation temperature output from the temperature detecting part with one of the reference values from the reference value outputting part and outputting a comparison result; and a second temperature control part controlling the operation temperature of the optical filter based on the comparison results.

19. The optical module as claimed in claim 14, wherein the light-emitting element includes an array of laser diodes.

20. The optical module as claimed in claim 18, wherein the light-emitting element includes a tandem alignment of laser diodes.

21. The optical module as claimed in claim 14, wherein the light-emitting element includes a tandem alignment of laser diodes.

22. An optical module comprising:

a light-emitting element;

a first temperature control part controlling a temperature of the light-emitting element;

a first light receiving part receiving a light from the light emitting element;

a second light receiving part receiving the light from the light-emitting element via an optical filter; and a second temperature control part controlling a temperature of the optical filter, wherein:

the first light-receiving part includes a light receiving element having a semi-transparent structure; and the optical filter filters the light from the first light receiving part, so that a filtered light is applied to the second light receiving part.

23. The optical module as claimed in claim 22, wherein the optical filter is an etalon filter.

24. The optical module as claimed in claim 22, wherein the optical filter is a Fabry-Perot etalon filter.

25. The optical module as claimed in claim 22, wherein temperature sensing elements are respectively mounted on the first and second temperature control parts.

26. The optical module as claimed in claim 22, further comprising:

a first splitter by which the light from the light-emitting element goes toward the first light receiving part; and a second splitter by which the light from the light-emitting element goes toward the second light receiving part.

* * * * *

UNITED STATES PATENT AND TRADEMARK OFFICE
CERTIFICATE OF CORRECTION

PATENT NO.    : 6,477,190 B1
DATED         : November 5, 2002
INVENTOR(S)   : Manabu Komiyama et al.

It is certified that error appears in the above-identified patent and that said Letters Patent is hereby corrected as shown below:

Title page,
Item [73], Assignee, change "Kawsaki" to -- Kawasaki --

Signed and Sealed this

Fourth Day of March, 2003

JAMES E. ROGAN
*Director of the United States Patent and Trademark Office*